United States Patent
Yasuda et al.

(10) Patent No.: US 8,698,142 B2
(45) Date of Patent: Apr. 15, 2014

(54) ORGANIC SEMICONDUCTOR ELEMENT, METHOD OF MANUFACTURING ORGANIC SEMICONDUCTOR ELEMENT, ELECTRONIC DEVICE, ELECTRONIC EQUIPMENT AND INSULATING LAYER FORMING COMPOSITION

(75) Inventors: Takuro Yasuda, Suwa (JP); Takeo Kawase, Suwa (JP); Junichi Karasawa, Shimosuwa-machi (JP); Keiichi Inoue, Suwa (JP); Kazushi Omote, Suita (JP); Tomoya Arai, Suita (JP); Keiko Ando, Suita (JP); Yoshinobu Asako, Suita (JP)

(73) Assignee: Seiko Epson Corporation, Tokyo (JP)

(*) Notice: Subject to any disclaimer, the term of this patent is extended or adjusted under 35 U.S.C. 154(b) by 480 days.

(21) Appl. No.: 13/119,979

(22) PCT Filed: Sep. 18, 2009

(86) PCT No.: PCT/JP2009/066400
§ 371 (c)(1),
(2), (4) Date: Mar. 21, 2011

(87) PCT Pub. No.: WO2010/032834
PCT Pub. Date: Mar. 25, 2010

(65) Prior Publication Data
US 2011/0175092 A1    Jul. 21, 2011

(30) Foreign Application Priority Data
Sep. 22, 2008 (JP) .................. 2008-242936
Sep. 22, 2008 (JP) .................. 2008-242937

(51) Int. Cl.
*H01L 29/08* (2006.01)
*H01L 35/24* (2006.01)
*H01L 51/00* (2006.01)
*H01L 29/04* (2006.01)

(52) U.S. Cl.
USPC .............................. 257/57; 257/40

(58) Field of Classification Search
USPC ........................................ 257/40, 57
See application file for complete search history.

(56) References Cited

U.S. PATENT DOCUMENTS

| 6,215,130 | B1 | 4/2001 | Dodabalapur |
| 6,284,562 | B1* | 9/2001 | Batlogg et al. ............... 438/99 |
| 6,506,438 | B2* | 1/2003 | Duthaler et al. ............. 427/58 |
| 7,326,957 | B2* | 2/2008 | Halik et al. .................. 257/40 |
| 7,385,221 | B1* | 6/2008 | Anthony et al. ............. 257/40 |
| 7,750,342 | B2* | 7/2010 | Kim et al. .................... 257/40 |
| 7,786,494 | B2* | 8/2010 | Lee et al. ..................... 257/88 |
| 8,231,983 | B2* | 7/2012 | Sugita et al. ................ 428/690 |

FOREIGN PATENT DOCUMENTS

| JP | 2000-068523 |   | 3/2000 |
| JP | 2001-049110 |   | 2/2001 |
| JP | 2001049110 | A * | 2/2001 |
| JP | 2001-177109 |   | 6/2001 |
| JP | 2002-064253 |   | 2/2002 |
| JP | 2003-183495 | A | 7/2003 |
| JP | 2004-103719 |   | 4/2004 |

OTHER PUBLICATIONS

Search Report received in International Application No. PCT/JP2009/066400, Nov. 10, 2009.

* cited by examiner

*Primary Examiner* — Jarrett Stark
*Assistant Examiner* — Nicholas Tobergte
(74) *Attorney, Agent, or Firm* — ALG Intellectual Property, LLC

(57) ABSTRACT

The present invention provides an organic semiconductor element which has a low hygroscopic property and whose property is hardly deteriorated with time and an electronic device and electronic equipment each provided with such an organic semiconductor element and having high reliability.

The organic semiconductor element of the present invention includes: a source electrode 20a; a drain electrode 20b; a gate electrode 50; a gate insulating layer 40; an organic semiconductor layer 30; and a buffer layer (another insulating layer) 60, wherein at least one of the gate insulating layer 40 and the buffer layer 60 contains an insulating polymer with a main chain having both end portions and including repeating units represented by the following general formula (1) or (2):

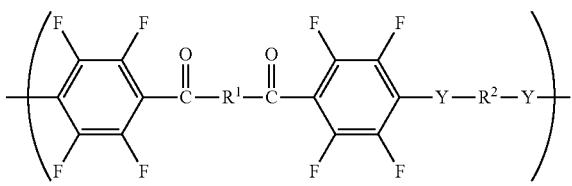

Formula (1)

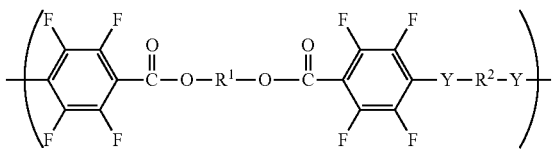

Formula (2)

where $R^1$ and $R^2$ are the same or different and each of $R^1$ and $R^2$ is a divalent linkage group, and Y is an oxygen atom or a sulfur atom.

15 Claims, 7 Drawing Sheets

ORGANIC SEMICONDUCTOR ELEMENT, METHOD OF MANUFACTURING ORGANIC SEMICONDUCTOR ELEMENT, ELECTRONIC DEVICE, ELECTRONIC EQUIPMENT AND INSULATING LAYER FORMING COMPOSITION

CROSS-REFERENCE TO RELATED APPLICATION

This application is based on and claims priority from Japanese Patent Application No. 2008-242937, filed on Sep. 22, 2008, and Japanese Patent Application No. 2008-242936, filed on Sep. 22, 2008, the contents of which are incorporated herein by reference.

TECHNICAL FIELD

The present invention relates to an organic semiconductor element, a method of manufacturing an organic semiconductor element, an electronic device, electronic equipment and an insulating layer forming composition.

BACKGROUND ART

Recently, development of a thin film transistor using an organic material which exhibits a semiconducting property (that is, an organic semiconductor material) is advanced.

This thin film transistor is suitable for being made thinner and for reducing weight, has flexibility and can be manufactured at a low material cost. Such a thin film transistor having the above advantages is expected to be used as switching devices of a flexible display.

It is known that an inorganic material is often used as a constituent material of, a gate insulating layer of such a thin film transistor (see, for example, patent document 1: JP-A 2004-103719).

However, in the thin film transistor, the gate insulating layer is formed using a vapor phase film forming method. Therefore, there is a problem in that the formation of the gate insulating layer becomes complex and takes a long period of time. Further, there is also a fear that an organic semiconductor layer of the thin film, transistor is alternated or deteriorated during the formation of the gate insulating layer.

In order to resolve the above disadvantages, as the constituent material of the gate insulating layer, for example, a phenol-based resin, an acryl-based resin or the like is often used.

On the contrary, since these resins have polarity, they exhibit high hygroscopicity. In the case where a thin film transistor having the gate insulating layer constituted from such a resin material is used in the air, the gate insulating layer absorbs moisture. When an amount of water contained in the gate insulating layer is increased, ion current begins to flow through the gate insulating layer. This causes problems such as shift of threshold voltage (Vth) of the thin film transistor, increase of gate leak current and easy occurrence of dielectric breakdown.

DISCLOSURE OF THE INVENTION

Accordingly, it is an object of the present invention to provide an organic semiconductor element which has a low hygroscopic property and whose property is hardly deteriorated with time and a method of manufacturing such an organic semiconductor element, an insulating layer forming composition used for constituting such an organic semiconductor element, and an electronic device and electronic equipment each provided with such an organic semiconductor element and having high reliability.

This object is achieved by the present inventions described below.

An organic semiconductor element, comprising:
a source electrode;
a drain electrode;
a gate electrode;
a gate insulating layer that insulates the source electrode and the drain electrode from the gate electrode;
an organic semiconductor layer provided so as to make contact with the gate insulating layer, the source electrode and the drain electrode; and
another insulating layer provided so as to make contact with the organic semiconductor layer at an opposite side from the gate insulating layer,
wherein at least one of the gate insulating layer and another insulating layer contains an insulating polymer with a main chain having both end portions and including repeating units represented by the following general formula (1) or (2):

[Formula 1]

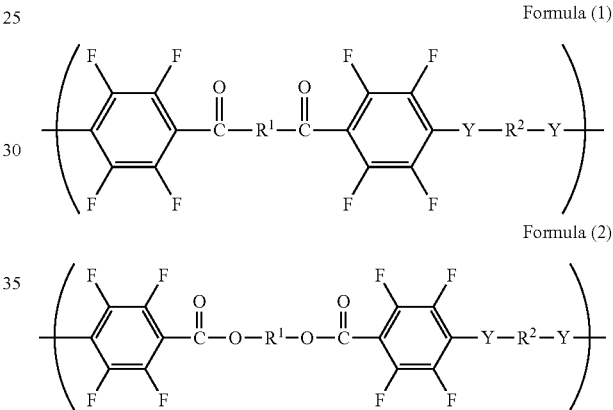

where $R^1$ and $R^2$ are the same or different and each of $R^1$ and $R^2$ is a divalent linkage group, and Y is an oxygen atom or a sulfur atom.

Since the insulating polymer with the main chain including repeating units represented by the above general formula (1) or (2) contains the fluorinated aromatic rings, it exhibits a low hygroscopic property. Therefore, in the case where at least one of the gate insulating layer and another insulating layer (hereinbelow, collectively referred to as "insulating layer" on occasion) contains such an insulating polymer, it is possible to obtain an organic semiconductor element which has a low hygroscopic property and whose property is hardly deteriorated with time.

Especially, in the case where Y is the oxygen atom, it is possible to dissolve the insulating polymer into a solvent having higher polarity. In addition, in the case where the gate insulating layer contains the insulating polymer, the oxygen atom can trap holes induced within the organic semiconductor layer, thereby preventing conductibility from being imparted to the organic semiconductor layer.

In the organic semiconductor element of the present invention, it is preferred that a permittivity at 100 kHz of the at least one of the gate insulating layer and another insulating layer is 2.9 or more.

Especially, in the case where the permittivity of the insulating layer falls within the above range, it is possible to lower operating voltage of the thin film transistor, while maintaining an insulating property of the gate insulating layer 40 sufficiently.

In the organic semiconductor element of the present invention, it is preferred that a weight-average molecular weight of the insulating polymer is in the range of 5,000 to 500,000.

This makes it possible to improve mechanical strength of an insulating layer formed using the insulating polymer. Further, a viscosity of a solution prepared by dissolving the insulating polymer into a solvent can be set to a value suitable for a liquid phase process. Therefore, it is possible to form a gate insulating layer and/or another insulating layer having sufficient mechanical strength (film strength) through the liquid phase process relatively easily.

In the organic semiconductor element of the present invention, it is preferred that at least one of the end portions of the main chain of the insulating polymer is substituted by a fluorine atom or a substituent group containing fluorine atom(s), and a theoretical phenol value of the insulating polymer is 2.0 KOH mg/polymer g or less.

By defining a polymer structure (molecular structure) of the insulating polymer to be used and the number of the phenolic hydroxyl groups included therein in order to set the theoretical phenol value to the above range, it is possible to obtain an organic semiconductor element which has a lower hygroscopic property and whose property is hardly deteriorated with time.

In the organic semiconductor element of the present invention, it is preferred that the substituent group containing fluorine atom(s) is represented by the following chemical formula:

[Formula 2]

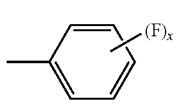

where X is an integral number of 1 to 5.

In such a molecular structure, the fluorine atom(s) is(are) bonded to the benzene ring (conjugate chemical structure). Therefore, in the molecular structure of the insulating polymer, electrons are biased towards the fluorine atom(s). As a result, such an insulating polymer hardly extracts electrons from other adjacent molecules.

For this reason, especially, in the case where the gate insulating layer contains such an insulating polymer, it can have only low electron attractive force from the organic semiconductor layer. This makes it possible to more reliably prevent the conductibility from being imparted to the organic semiconductor layer.

In the organic semiconductor element of the present invention, it is preferred that in the general formula (1) or (2), $R^1$ and $R^2$ are the same or different and each of $R^1$ and $R^2$ is any one of the following chemical formulas (3-1) to (3-13).

[Formula 3]

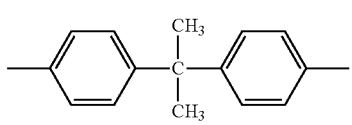

(3-1)

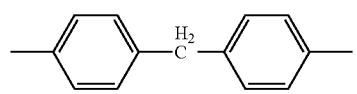

(3-2)

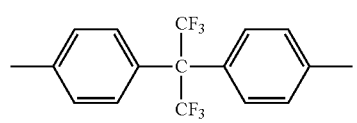

(3-3)

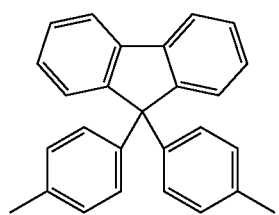

(3-4)

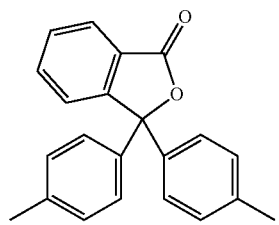

(3-5)

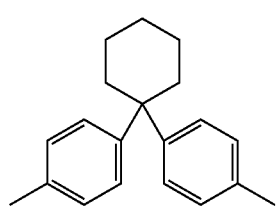

(3-6)

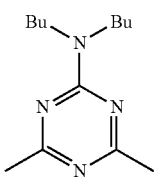

(3-7)

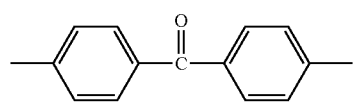

(3-8)

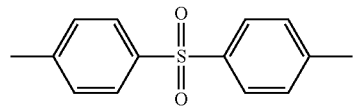

(3-9)

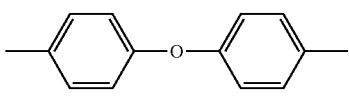

(3-10)

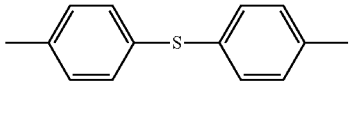

(3-11)

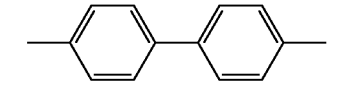

(3-12)

-continued

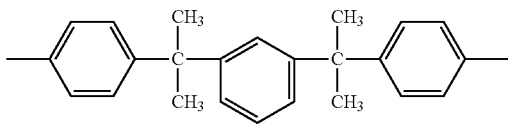

(3-13)

By selecting any one of the substituent groups represented by the above chemical formulas (3-1) to (3-13) as each of $R^1$ and $R^2$, the insulating polymer can exhibit a higher insulating property. This makes it possible to form a gate insulating layer and/or another insulating layer having a high insulating property. Further, in this case, it is also possible to improve mechanical strength (film strength) of an insulating layer (insulating film) formed using such an insulating polymer.

In the organic semiconductor element of the present invention, it is preferred that in the general formula (1) or (2), each of $R^1$ and $R^2$ includes no polar group.

This makes it possible to relatively lower polarity of the insulating polymer. Such an insulating polymer becomes a more suitable material of the gate insulating layer. This is because generation of a trapping level which interferes with electrical conduction in the organic semiconductor layer can be suppressed.

In the organic semiconductor element of the present invention, it is preferred that in the general formula (1) or (2), $R^1$ and $R^2$ are the same or different and each of $R^1$ and $R^2$ is any one of the chemical formulas (3-1), (3-2), (3-4) and (3-10).

In this case, the insulating polymer can exhibit an even higher insulating property. Further, molecules of the insulating polymer are mutually attracted together due to existence of the aromatic rings included therein, to thereby enhance cohesion force between the molecules of the insulating polymer. This makes it possible to further enhance the mechanical strength of the insulating layer.

In the organic semiconductor element of the present invention, it is preferred that the organic semiconductor element further comprises a substrate and has a top gate structure in which the source electrode and the drain electrode are positioned closer to the substrate than the gate electrode, and at least the gate insulating layer contains the insulating polymer.

Since the insulating polymer includes the carbonyl groups or the ester groups, it can be sufficiently dissolved into a solvent having relatively high polarity. Such a solvent hardly takes up or swells the organic semiconductor layer. Therefore, in the thin film transistor having the top gate structure, even if the gate insulating layer is formed through a liquid phase process, it is possible to appropriately prevent alteration and deterioration of the organic semiconductor layer.

In the organic semiconductor element of the present invention, it is preferred that an average thickness of the gate insulating layer is in the range of 10 to 5,000 nm.

By setting the thickness of the gate insulating layer to a value within the above range, it is possible to reliably insulate the gate electrode from the source electrode and the drain electrode. This makes it possible to decrease operating voltage of the thin film transistor.

A method of manufacturing an organic semiconductor element having a source electrode, a drain electrode, a gate electrode, a gate insulating layer that insulates the source electrode and the drain electrode from the gate electrode, an organic semiconductor layer provided so as to make contact with the gate insulating layer, the source electrode and the drain electrode, and another insulating layer provided so as to make contact with the organic semiconductor layer at an opposite side from the gate insulating layer, the method comprising:

a first step of forming another insulating layer;

a second step of forming the source electrode and the drain electrode on another insulating layer so as to be separated from each other;

a third step of forming the organic semiconductor layer so as to make contact with the source electrode and the drain electrode;

a fourth step of forming the gate insulating layer so as to cover the source electrode, the drain electrode and the organic semiconductor layer; and a fifth step of forming the gate electrode on the gate insulating layer so as to correspond to a region between the source electrode and the drain electrode, wherein at least one of the first step and the fourth step is carried out through a liquid phase process using a solution prepared by dissolving an insulating polymer with a main chain having both end portions and including repeating units represented by the following general formula (1) or (2) into a solvent:

[Formula 4]

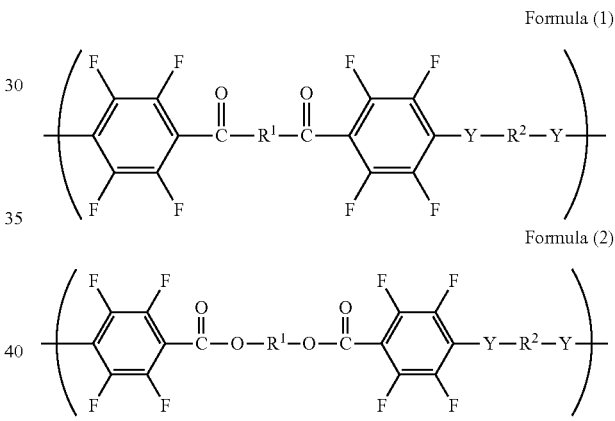

Formula (1)

Formula (2)

where $R^1$ and $R^2$ are the same or different and each of $R^1$ and $R^2$ is a divalent linkage group, and Y is an oxygen atom or a sulfur atom.

According to the liquid phase process, it is possible to form the insulating layer at a low temperature. This makes it possible to prevent the property of the thin film transistor from being lowered due to experience of thermal hysteresis at a high temperature. As a result, it is possible to obtain an organic semiconductor element which has a low hygroscopic property and whose property is hardly deteriorated with time.

In the method of the present invention, it is preferred that at least one of the end portions of the main chain of the insulating polymer is substituted by a fluorine atom or a substituent group containing fluorine atom(s), and a theoretical phenol value of the insulating polymer is 2.0 KOH mg/polymer g or less.

By defining a polymer structure (molecular structure) of the insulating polymer to be used and the number of the phenolic hydroxyl groups included therein in order to set the theoretical phenol value to the above range, it is possible to obtain an organic semiconductor element which has a lower hygroscopic property and whose property is hardly deteriorated with time.

In the method of the present invention, it is preferred that the solvent is at least one of a ketone-based solvent and an ester-based solvent.

The insulating polymer can be highly dissolved into a solvent having relatively high polarity such as a ketone-based solvent or an ester-based solvent. Further, such a solvent hardly takes up or swells the organic semiconductor layer. Therefore, in a thin film transistor having a top gate structure, even if a gate insulating layer is formed through a liquid phase process, it is possible to appropriately prevent alteration and deterioration of an organic semiconductor layer.

In the method of the present invention, it is preferred that in the fifth step, the gate electrode is formed through a liquid phase process using an electrode forming material prepared by dispersing a conductive polymer or metal particles into a water-based dispersion medium.

In such a liquid phase process, by applying the electrode forming material using an ink-jet method, it is possible to easily form a gate electrode having high dimensional accuracy.

An electronic device of the present invention comprises the above organic semiconductor element.

Such an electronic device can have high reliability.

Electronic equipment of the present invention comprises the above electronic device.

Such electronic equipment can have high reliability.

An insulating layer forming composition of the present invention comprises an insulating polymer with a main chain having both end portions and including repeating units represented by the following general formula (1) or (2):

[Formula 5]

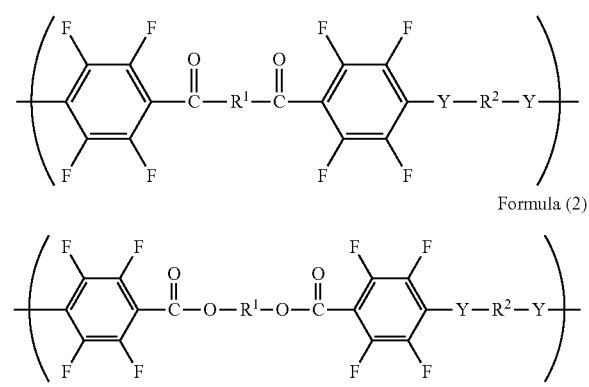

where $R^1$ and $R^2$ are the same or different and each of $R^1$ and $R^2$ is a divalent linkage group, and Y is an oxygen atom or a sulfur atom.

Since the insulating polymer has the low hygroscopic property as described above, by forming at least one of the above mentioned gate and another insulating layers using the insulating layer forming composition containing such an insulating polymer, it is possible to obtain an organic semiconductor element which has a low hygroscopic property and whose property is hardly deteriorated with time.

Further, since the insulating polymer includes the carbonyl groups or the ester groups in the chemical structure of the main chain thereof, it can be dissolved into a solvent having relatively high polarity. As a result, in the case where the insulating layer forming composition is prepared, various kinds of solvents, which are usually used in a step of forming an insulating layer of an organic semiconductor element, can be widely utilized.

This makes it possible to prepare, for example, a solution (insulating layer forming composition) suitable for a liquid phase process. By using such a solution, it is possible to easily form a gate insulating layer and/or another insulating layer (buffer layer) having a uniform thickness and sufficient mechanical strength (film strength).

In the insulating layer forming composition of the present invention, it is preferred that at least one of the end portions of the main chain of the insulating polymer is substituted by a fluorine atom or a substituent group containing fluorine atom(s), and a theoretical phenol value of the insulating polymer is 2.0 KOH mg/polymer g or less.

By defining a polymer structure (molecular structure) of the insulating polymer to be used and the number of the phenolic hydroxyl groups included therein in order to set the theoretical phenol value to the above range, it is possible to obtain an organic semiconductor element which has a lower hygroscopic property and whose property is hardly deteriorated with time.

BEST MODE FOR CARRYING OUT THE INVENTION

Hereinbelow, an organic semiconductor element, a method of manufacturing an organic semiconductor element, an electronic device, electronic equipment and an insulating layer forming composition according to the present invention will be described in detail with reference to preferred embodiments shown in the accompanying drawings.

In this regard, description will be representatively described on a case that the organic semiconductor element according to the present invention is used in an active matrix device.

<Active Matrix Device>

Figure 1:
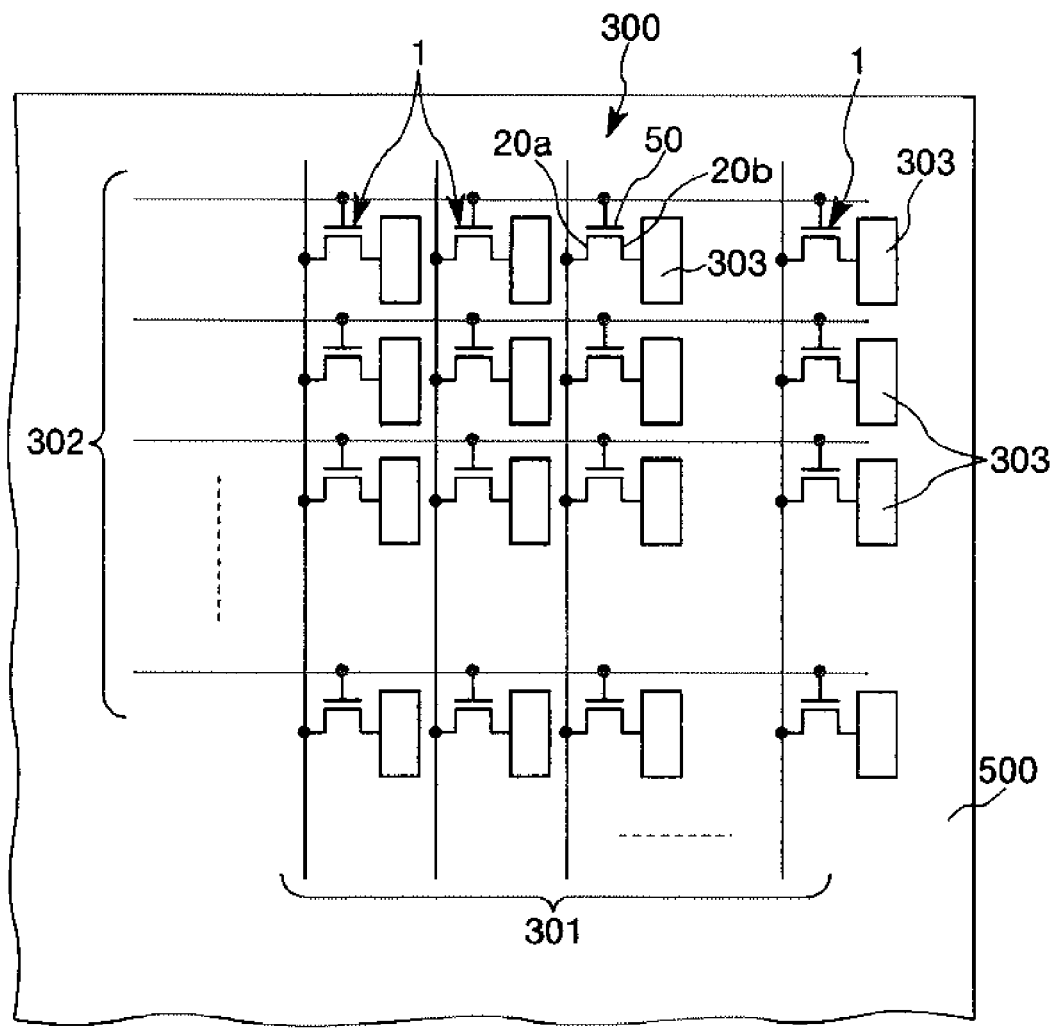
FIG. 1 is a block diagram showing a configuration of an active matrix device in which an organic semiconductor element according to the present invention is used.
Figure 2:
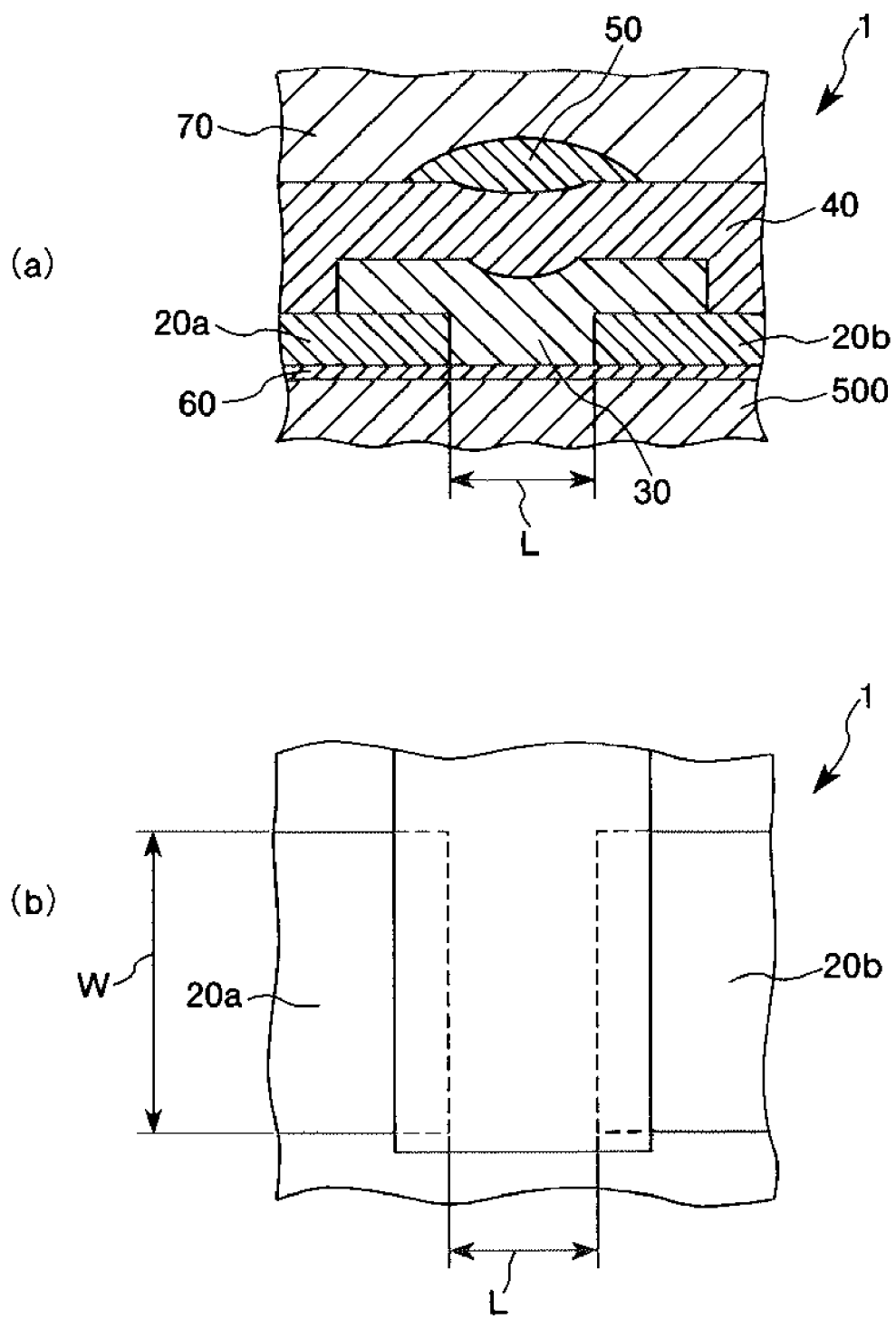
FIGS. 2(a) and 2(b) are vertical section and plan views each showing a configuration of the organic semiconductor element provided in the active matrix device shown in FIG. 1.

FIG. 1 is a block diagram showing a configuration of the active matrix device in which the organic semiconductor element according to the present invention is used. FIGS. 2(a) and 2(b) are vertical section and plan views each showing a configuration of the organic semiconductor element provided in the active matrix device shown in FIG. 1. FIGS. 3(a) to 3(d), 4(e) and 4(f) are vertical section views each showing a step of producing the organic semiconductor element shown in FIGS. 2(a) and 2(b).

In this regard, it is to be noted that the upper side in each of FIGS. 2(a), 2(b), 3(a) to 3(d), 4(e) and 4(f) will be referred to as "upper" and the lower side therein will be referred to as "lower" in the following description.

The active matrix device 300 shown in FIG. 1 includes a substrate 500, a plurality of data lines 301, a plurality of scanning lines 302 being mutually perpendicular to the data lines 301, organic thin film transistors 1 (hereinbelow, referred to as "thin film transistor(s) 1") provided near intersecting points of the data lines 301 with the scanning lines 302 and pixel electrodes 303 provided near the intersecting points.

In this regard, all the data lines 301, the scanning lines 302, the thin film transistors 1 and the pixel electrodes 303 are provided on the substrate 50.

Further, each of the thin film transistors 1 includes a gate electrode 50 connected to the scanning line 302, a source electrode 20a connected to the data line 301 and a drain electrode 20b connected to the pixel electrode (individual electrode) 303.

The thin film transistor 1 of this embodiment has an top gate structure in which the source electrode 20a and the drain electrode 20b are positioned closer to the substrate 500 than the gate electrode 50.

Specifically, as shown in FIG. 2(a), this thin film transistor 1 includes a buffer layer (second insulating layer) 60 provided on the substrate 500, the source electrode 20a and the drain electrode 20b provided on the buffer layer at a predetermined distance, an organic semiconductor layer 30 provided so as to make contact with the source electrode 20a and the drain electrode 20b, a gate insulating layer 40 provided between the organic semiconductor layer 30 and the gate electrode 50 and a protective layer 70 provided so as to cover these layers.

Hereinbelow, the above components of the thin film transistor 1 will be described one by one.

The substrate 500 supports the above layers (components) constituting the thin film transistor 1 (active matrix device 300).

As the substrate 500, for example, a glass substrate, a plastics substrate (resin substrate) made of polyethylene terephthalate (PET), polyethylene naphthalate (PEN), polyethersulfone (PES), aromatic polyester (liquid crystal polymer), polyimide or the like, a quartz substrate, a silicon substrate, a metal substrate or a gallium arsenide substrate can be used.

In the case where flexibility is imparted to the thin film transistor 1, the plastics substrate or a thin metal substrate (that is, a metal substrate having a relatively thin thickness) is selected as the substrate 500.

On the substrate 500, the buffer layer (foundation layer) 60 is provided.

This buffer layer 60 can prevent infiltration of moisture into the organic semiconductor layer 30 described below. Further, in the case where the substrate 500 is made of a glass material or the like, the buffer layer (another insulating layer) 60 also can prevent diffusion of ions or the like from the substrate 500 into the organic semiconductor layer 30.

At least one of the buffer layer 60 and the gate insulating layer 40 which make contact with the organic semiconductor layer 30 contains an insulating polymer with a main chain including repeating units represented by a general formula (1) or (2), but both layers preferably contain the above insulating polymer. In this regard, such an insulating polymer will be described below in detail.

An average thickness of the buffer layer 60 is preferably in the range of about 1 nm to 20 μm, more preferably in the range of about 10 nm to 1 μm, and even more preferably in the range of about 0.1 to 7 μm.

In this regard, it is to be noted that one or more layers may be provided between the buffer layer 60 and the substrate 500 in an arbitrary purpose. Examples of such a purpose include improvement of adhesiveness between the thin film transistor 1 and the substrate 500, improvement of a property for insulating the thin film transistor 1 and the like.

On the buffer layer 60, the source electrode 20a and the drain electrode 20b are provided at a predetermined distance.

Examples of a constituent material of each of the source electrode 20a and the drain electrode 20b include metal materials such as Au, Ag, Cu, Pt, Ni, Cr, Ti, Ta, Al and alloys containing at least one of them. These metal materials can be used singly or in combination of two or more of them.

Among them, as the constituent material of each of the source electrode 20a and the drain electrode 20b, preferable is one mainly composed of Au, Ag, Cu, Pt or alloys containing at least one of them. Each of the metal materials has a relatively high work function. Therefore, by making the source electrode 20a using such a metal material, in the case where the organic semiconductor layer 30 is a p-type, it is possible to improve injection efficiency of holes (carriers) thereinto.

In this regard, it is to be noted that an average thickness of each of the source electrode 20a and the drain electrode 20b is not limited to a specific value, but is preferably in the range of about 10 to 2,000 nm, and more preferably in the range of about 50 to 1,000 nm.

The distance between the source electrode 20a and the drain electrode 20b, that is, a channel length L shown in FIG. 2(b) is preferably in the range of about 0.5 to 100 μm, more preferably in the range of about 1 to 50 μm, even more preferably in the range of about 2 to 30 μm, and, in particular, preferably in the range of about 2 to 20 μm.

By setting the channel length L to a value within the above range, it is possible to improve the property of the thin film transistor 1 (especially, increase of an ON current value).

Further, a length of each of the source electrode 20a and the drain electrode 20b, that is, a channel width W shown in FIG. 2(b) is preferably in the range of about 0.1 to 5 mm, and more preferably in the range of about 0.3 to 3 mm.

By setting the channel width W to a value within the above range, it is possible to reduce a parasitic capacitance of the thin film transistor 1, thereby preventing the property thereof from being lowered. Further, it is possible to prevent the thin film transistor 1 from becoming big.

The organic semiconductor layer 30 is provided so as to make contact with the source electrode 20a and the drain electrode 20b.

Examples of a constituent material of the organic semiconductor layer 30 include: a high-molecular type organic semiconductor material such as poly(3-alkyl thiophene), poly(3-hexyl thiophene) (P3HT), poly(3-octyl thiophene), poly(2,5-thienylenevinylene) (PTV), poly(para-phenylenevinylene) (PPV), poly(2-methoxy, 5-(2'-ethyl hexoxy)-para-phenylenevinylene) (MEH-PPV), poly(9,9-dioctyl fluorene) (PFO), poly(9,9-dioctyl fluorene-co-bis-N,N'-(4-methoxyphenyl)-bis-N,N'-phenyl 1,4-phenylenediamine) (PFMO), poly(9,9-dioctyl fluorine-co-benzothiadiazole) (BT), a fluorene-triaryl amine copolymer, a triaryl amine-based polymer, a fluorene-bithiophene copolymer (F8T2) or polyaryl amine (PAA); a low-molecular type organic semiconductor material such as an acene molecular material (e.g., fullerene, metallophthalocyanine or a derivative thereof, anthracene, tetracene, pentacene or hexacene) or a α-oligothiophene (e.g., quarterthiophene (4T), sexithiophene (6T), octithiophene (8T), dihexyl quarterthiophene (DH4T), dihexyl sexithiophene (DH6T)) and the like. These organic semiconductor materials can be used singly or in combination of two or more of them.

Among them, in particular, used is preferably one mainly composed of the high-molecular type organic semiconductor material. This is because the high-molecular type organic semiconductor material is suitable for use in a liquid phase process and also has a high carrier transport ability.

In this regard, the liquid phase process is a method in which a liquid material is prepared by dissolving or dispersing a material to be film-formed, and then applied using a spin coating method, a dip coating method, a liquid droplet ejection method (ink-jet method) or the like to thereby form a thin film.

Further, the organic semiconductor layer 30 constituted from the high-molecular type organic semiconductor material as a main component thereof can be made thinner and save weight, and has excellent flexibility. Therefore, such an organic semiconductor layer 30 is suitable for use in the thin film transistor 1 which can be utilized as switching elements of a flexible display or the like.

An average thickness of the organic semiconductor layer 30 is not limited to a specific value, but is preferably in the range of about 0.1 to 1,000 nm, more preferably in the range of about 1 to 500 nm, and even more preferably in the range of about 1 to 100 nm.

In this regard, it is to be noted that the organic semiconductor layer 30 may be selectively provided on a region (channel region) between the source electrode 20a and the drain electrode 20b, or may be provided so as to cover over almost all the source electrode 20a and the drain electrode 20b.

The gate insulating layer 40 is provided so as to make contact with the organic semiconductor layer 30 and to cover the organic semiconductor layer 30, the source electrode 20a and the drain electrode 20b.

This gate insulating layer 40 insulates the gate electrode 50 described below from the source electrode 20a and the drain electrode 20b.

An average thickness of the gate insulating layer 40 is not limited to a specific value, but is preferably in the range of about 10 to 5,000 nm, and more preferably in the range of about 100 to 2,000 nm.

By setting the thickness of the gate insulating layer 40 to a value within the above range, it is possible to reliably insulate the gate electrode 50 from the source electrode 20a and the drain electrode 20b, and to decrease operating voltage of the thin film transistor 1.

As described below, an insulating polymer constituting the gate insulating layer 40 (that is, an insulating polymer with a main chain including repeating units represented by a general formula (1) or (2) (insulating layer forming composition)) is suitable for use in a liquid phase process. Therefore, it is possible to form a gate insulating layer 40 having a relatively thin thickness falling within the above range through the liquid phase process in a relatively easy and precision manner.

At a predetermined position on the gate insulating layer 40, that is, a position corresponding to a region between the source electrode 20a and the drain electrode 20b, provided is the gate electrode 50 that applies voltage to the organic semiconductor layer 30.

Examples of a constituent material of the gate electrode 50 include metal materials such as Pd, Pt, Au, W, Ta, Mo, Al, Cr, Ti, Cu and alloys containing at least one of them, carbon materials such as carbon black, carbon nanotube and fullerene, conductive polymeric materials such as polyacetylene, polypyrrole, polythiophene (e.g., poly(3,4-ethylenedioxythiophene) (PEDOT)), polyaniline, poly(p-phenylene), poly(p-phenylenevinylene), polyfluorene, polycarbazole, polysilane or derivatives thereof, and a mixture containing at least one of them. These conductive materials can be used singly or in combination of two or more of them.

In this regard, it is to be noted that examples of the mixture type conductive polymeric material include poly(3,4-ethylenedioxythiophene) (PEDOT)/poly(styrene sulfonic acid) (PSS) and the like.

An average thickness of the gate electrode 50 is not limited to a specific value, but is preferably in the range of about 0.1 to 2,000 nm, more preferably in the range of about 1 to 1,000 nm, and even more preferably in the range of about 1 to 200 nm.

Further, the protective layer 70 is provided so as to cover the above respective layers.

This protective layer 70 has a function of preventing infiltration of moisture into the organic semiconductor layer 30 and a function of preventing occurrence of short between the thin film transistors 1 due to contact of foreign materials with the gate electrodes 50 thereof.

Examples of a constituent material of the protective layer 70 include an organic insulating material such as polystyrene, polyimide, polyamideimide, polyvinyl phenylene, polycarbonate (PC), an acrylic resin (e.g., polymethylmethacrylate (PMMA)), a fluorinated resin (e.g., polytetrafluoroethylene (PTFE)), a parylene resin (e.g., plyparaxylene), a polyvinyl alcohol resin (e.g., polyvinyl alcohol), a phenolic resin (e.g., polyvinyl phenol or novolac resin) or an olefin-based resin (e.g., polyethylene, polypropylene, polyisobutylene or polybutene), an inorganic insulating material such as SiO or SiN, and the like.

Further, as the constituent material of the protective layer 70, an insulating polymer with a main chain including repeating units represented by a general formula (1) or (2) which will be described below can be also used.

An average thickness of the protective layer 70 is not limited to a specific value, but is preferably in the range of about 0.01 to 20 µm, more preferably in the range of about 0.05 to 10 µm, and even more preferably in the range of about 0.1 to 5 µm.

In this regard, it is to be noted that the protective layer 70 may be provided according to need, and can be also omitted.

—Actuation of Thin Film Transistor 1—

In such a thin film transistor 1, in a state that voltage is applied between the source electrode 20a and the drain electrode 20b, when gate voltage is applied to the gate electrode 50, a channel region (flow path of carriers) is formed in the vicinity of a surface of the organic semiconductor layer 30 which makes contact with the gate insulating layer 40. At this time, the carriers (holes) move through the channel region. As a result, current flows between the source electrode 20a and the drain electrode 20b.

Namely, in an OFF-state that voltage is not applied to the gate electrode 50, only a little current flows even by applying voltage between the source electrode 20a and the drain electrode 20b. This is because carriers hardly exist in the organic semiconductor layer 30.

On the other hand, in an ON-state that voltage is applied to the gate electrode 50, an electric charge is induced in a portion of the organic semiconductor layer 30 which makes contact with the gate insulating layer 40 so that the channel region (flow path of carriers) is formed. In such a state, by applying voltage between the source electrode 20a and the drain electrode 20b, current flows through the channel region.

A permittivity at 100 kHz of at least one of the gate insulating layer 40 and the buffer layer 60 is preferably 2.9 or more, and more preferably 3.0 or more. It is preferred that the permittivity at 100 kHz of each layer falls within the above range.

Especially, by setting the permittivity of the gate insulating layer 40 to a value within the above range, the electric charge is more easily induced in the portion of the organic semiconductor layer 30 which makes contact with the gate insulating layer 40 in the above ON-state. This makes it possible to lower operating voltage of the thin film transistor 1, while maintaining the insulating property of the gate insulating layer 40 sufficiently.

Next, description will be made on an insulating polymer with a main chain including repeating units represented by a general formula (1) or (2).

[Formula 6]

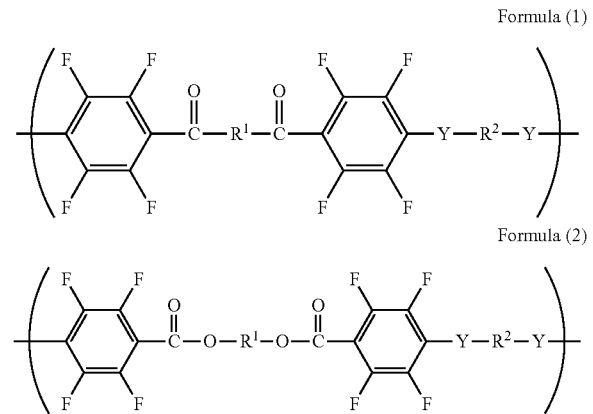

Formula (1)

Formula (2)

where $R^1$ and $R^2$ are the same or different and each of $R^1$ and $R^2$ is a divalent linkage group, and Y is an oxygen atom or a sulfur atom.

Since this insulating polymer contains the fluorinated aromatic rings, it exhibits a low hygroscopic property. In other words, the insulating polymer exhibits a high anti-hygroscopic property. In the case where an insulating layer is formed from such an insulating polymer, water absorption thereof can be set to a value of 0.1% or lower (preferably 0.07% or lower).

Therefore, in the case where the gate insulating layer 40 and the buffer layer 60 are constituted from the insulating polymer as main components thereof, it is possible to prevent deterioration of a property of the thin film transistor 1 (especially, shift (variation) of threshold voltage (Vth) resulting from generation of ion current, increase of gate leak current or occurrence of dielectric breakdown) which would occur due to moisture absorption of the organic semiconductor layer 30.

Since a fluorine atom has an electron attractive property, if the gate insulating layer 40 is formed of a fluorinated disconjugate polymer, fluorine atoms extract electrons from the organic semiconductor layer 30 adjacent to the gate insulating layer 40. As a result, holes are induced within the organic semiconductor layer 30 so that conductibility is imparted thereto. This causes increase of OFF-current in the thin film transistor 1.

On the other hand, in the above insulating polymer, fluorine atoms are bonded to a benzene ring (conjugate chemical structure). Therefore, in a chemical structure of the insulating polymer, electrons are biased towards the fluorine atoms. As a result, such an insulating polymer hardly extracts electrons from other molecules, that is, it has low electron attractive force from the organic semiconductor layer 30.

For these reasons, in the case where the gate insulating layer 40 contains the above insulating polymer (especially, the gate insulating layer 40 is constituted from the above insulating polymer as the main component thereof), it is possible to reliably prevent the conductibility from being imparted to the organic semiconductor layer 30.

Further, since the insulating polymer contain fluorinated benzene rings, it is possible to prevent aggregation of molecules of the insulating polymer. Therefore, such an insulating polymer exhibits high resolvability to various kinds of solvents. This makes it possible to form the gate insulating layer 40 and the buffer layer 60 through a liquid phase process, thereby lowering a production cost of the thin film transistor 1.

According to the liquid phase process, it is possible to form the insulating layer at a low temperature. This makes it possible to prevent the property of the thin film transistor 1 from being lowered due to experience of thermal hysteresis at a high temperature. In this regard, a method of forming the gate insulating layer 40 or the buffer layer 60 will be described below in detail.

Since the repeating unit represented by the formula (1) or (2) includes carbonyl groups (>C=O) or ester groups (—COO—), it is possible to dissolve the insulating polymer with the main chain including such repeating units into a solvent having relatively high polarity.

In the insulating polymer including the carbonyl groups (or ester groups), the oxygen atom contained in each carbonyl group (or each ester group) has a property of a weak Lewis acid due to existence of unshared electron pairs. Therefore, even if holes are induced within the organic semiconductor layer 30, the oxygen atom can trap the induced holes.

Especially, since each carbonyl group or each ester group is directly bonded to the fluorinated benzene ring, these chemical structures are conjugated to each other. Therefore, the oxygen atom contained in each carbonyl group or each ester group is capable of stabilizing a state that it traps the holes. For this reason, the insulating polymer can prevent the conductibility from being imparted to the organic semiconductor layer 30 more reliably.

Further, as described above, since the insulating polymer includes the carbonyl groups or the ester groups, it can be dissolved into a solvent having relatively high polarity such as a ketone-based solvent or an ester-based solvent. Such a solvent hardly takes up or swells the organic semiconductor layer 30.

Therefore, in the thin film transistor 1 having the top gate structure shown in this embodiment, even if the gate insulating layer 40 is formed through the liquid phase process, it is possible to appropriately prevent alteration and deterioration of the organic semiconductor layer 30.

For the above reasons, by constituting the gate insulating layer 40 from the insulating polymer including the fluorinated benzene rings, and the carbonyl groups or the ester groups as the main component thereof, it is possible to obtain a thin film transistor 1 capable of having a high ON/OFF ratio and being driven at low voltage.

A weight average molecular weight of such an insulating polymer is not limited to a specific value, but is preferably in the range of about 5,000 to 500,000, and more preferably in the range of about 20,000 to 190,000. In this regard, it is to be noted that the weight average molecular weight can be obtained using a GPC method in polystyrene equivalent.

If the weight average molecular weight is too low, when the gate insulating layer 40 and/or the buffer layer 60 are/is formed, there is a case that sufficient mechanical strength (film strength) or the like cannot be imparted thereto depending on kinds of the divalent linkage group $R^1$ or $R^2$.

On the other hand, if the weight average molecular weight is too high, a viscosity of a solution prepared by dissolving the insulating polymer into a solvent becomes too high. There is a possibility that it becomes difficult to form a layer through a liquid phase process.

In other words, by setting the weight average molecular weight of the insulating polymer to a value with the above range, it is possible to form a gate insulating layer 40 and/or a buffer layer 60 having sufficient mechanical strength (film strength) through the liquid phase process relatively easily.

Hereinbelow, description will be made on each of Y, $R^1$ and $R^2$ in the formula (1) or (2), respectively.

First, description will be made on Y in the formula (1) or (2)

Although, as described above, Y is the oxygen atom or the sulfur atom, it is preferred that Y is the oxygen atom. This makes it possible to dissolve the insulating polymer into a solvent having higher polarity. Further, in the case where the insulating polymer is used for forming the gate insulating layer 40, the oxygen atom can trap holes induced within the organic semiconductor layer 30, thereby preventing the conductibility from being imparted to the organic semiconductor layer 30 more reliably.

Next, description will be made on each of $R^1$ and $R^2$ in the formula (1) or (2).

Each of $R^1$ and $R^2$ is not limited to a specific type, but preferably contains at least one aromatic ring. Since the aromatic ring has π electrons, it exhibits a property of easily attracting other molecules. Therefore, molecules of the insulating polymer are mutually attracted together due to existence of the aromatic rings included therein, to thereby enhance cohesion force (polymer cohesion force) between the molecules of the insulating polymer. This makes it possible to further enhance the mechanical strength of the gate insulating layer 40 and/or the buffer layer 60 to be formed.

Examples of the aromatic ring contained in each of $R^1$ and $R^2$ include a benzene ring, a naphthalene ring, an anthracene ring, a phenanthrene ring, 1,3,5-triazine ring and the like. Among them, especially, an aromatic ring composed of one ring chemical structure such as the benzene ring or the 1,3,5-triazine ring is appropriately selected. This makes it possible to set a viscosity of a solution prepared by dissolving the insulating polymer into a solvent to a value suitable for use in a liquid phase process.

As each of $R^1$ and $R^2$, any one of substituent groups represented by the following chemical formulas (3-1) to (3-13) is preferably selected. In this regard, it is to be noted that $R^1$ and $R^2$ may be the same substituent group, or may be different substituent groups.

[Formula 7]

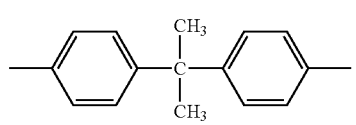

(3-1)

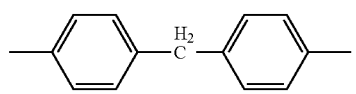

(3-2)

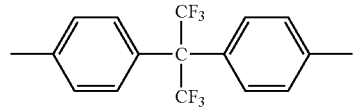

(3-3)

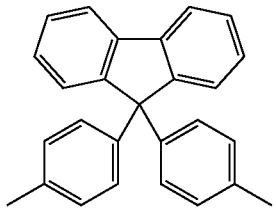

(3-4)

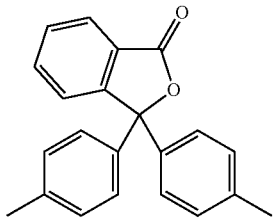

(3-5)

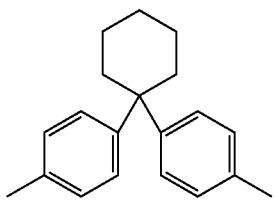

(3-6)

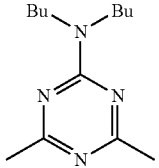

(3-7)

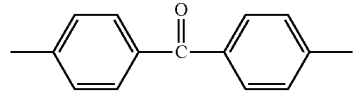

(3-8)

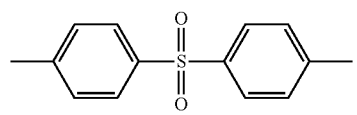

(3-9)

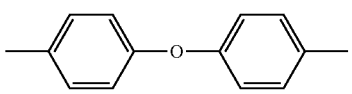

(3-10)

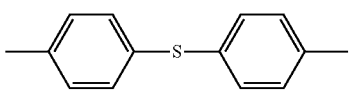

(3-11)

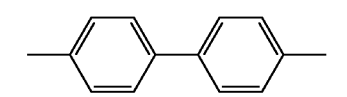

(3-12)

(3-13)

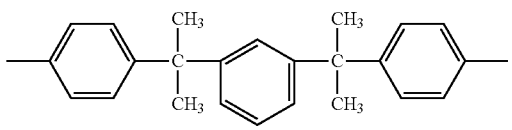

By selecting any one of the substituent groups represented by the above chemical formulas (3-1) to (3-13) as each of $R^1$ and $R^2$, the insulating polymer can exhibit a higher insulating property. Further, in this case, it is possible to improve the mechanical strength (film strength) of the insulating layer (gate insulating layer 40 or buffer layer 60) to be formed using the insulating polymer.

Furthermore, it is preferred that each of $R^1$ and $R^2$ contains no polar group. This makes it possible to relatively lower polarity of the insulating polymer. Therefore, such an insulating polymer becomes a more suitable material of the gate insulating layer 40. This is because generation of a trapping level which interferes with electrical conduction in the organic semiconductor layer 30 can be suppressed.

In this regard, examples of the polar group include a carbonyl group (>C=O), a sulfonyl group (>S(=O)$_2$—), —CF$_3$, —N(Bu)$_2$ and the like.

Further, among the substituent groups represented by the above chemical structures (3-1) to (3-13), it is preferred that each of $R^1$ and $R^2$ is a substituent group represented by the following general formula. More specifically, as each of $R^1$ and $R^2$, any one of the above chemical formulas (3-1), (3-2), (3-4) and (3-10) is preferably selected. In this case, the insulating polymer can exhibit an even higher insulating property.

[Formula 8]

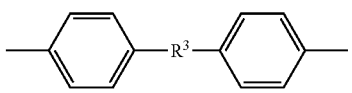

where $R^3$ is an oxygen atom, an alkylene group having carbon atom number of 1 to 3 or a linkage group including two or more aromatic groups.

By selecting each of $R^1$ and $R^2$ from the substituent groups represented by the above chemical formulas (3-1) to (3-13) (preferably, the above chemical formulas (3-1), (3-2), (3-4) and (3-10)), it is possible to adjust threshold voltage (Vth), an ON/OFF ratio and the like of the thin film transistor 1 to designed values.

Further, it is preferred that at least one of end portions of the main chain of the insulating polymer is substituted by a fluorine atom or a substituent group containing fluorine atom(s), and a theoretical phenol value of the insulating polymer is 2.0 KOH mg/polymer g or less. In other words, it can be also viewed that at least one of ends of such an insulating polymer is terminated by a fluorine atom.

Such an insulating polymer has an especially excellent hygroscopic property, because the at least one of the end portions of the main chain thereof is substituted by the fluorine atom or the substituent group containing fluorine atom(s), and the main chain includes the fluorinated aromatic rings. Therefore, the water absorption of an insulating layer containing such an insulating polymer is set to a value within the above range more reliably.

In this regard, the theoretical phenol value is a value that theoretically represents the number of phenolic hydroxyl groups (—OH) per 1 g of a polymer. The smaller theoretical phenol value means that the number of the phenolic hydroxyl groups contained in a unit weight of the insulating polymer is far fewer. Therefore, by setting the theoretical phenol value of the insulating polymer to a value within the above range, it becomes possible to obtain an insulating layer having a further high insulating property.

Such an insulating polymer can be obtained by reacting a sealing agent with a phenolic ends of a main chain of a precursor of the insulating polymer to terminate the phenolic ends or by changing a feed ratio of raw materials (monomers) when synthesizing the insulating polymer.

In order to sufficiently impart the insulating property to the insulating layer as described above, the theoretical phenol value of the insulating polymer is preferably 2.0 KOH mg/polymer g or less, but is more preferably 1.0 KOH mg/polymer g or less, and even more preferably 0 KOH mg/polymer g or less. This makes it possible to conspicuously exhibit the above effects.

Further, examples of the substituent group containing fluorine atom(s) include a disconjugate chemical structure to which fluorine atom(s) is(are) bonded such as —CF$_3$, —CH$_2$CF$_3$, a conjugate chemical structure to which fluorine atom(s) is(are) bonded such as a chemical structure represented by the following formula, and the like, but it is not limited thereto. As the substituent group containing fluorine atom(s), the chemical structure represented by the following formula is preferably selected.

[Formula 9]

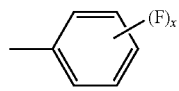

where X is an integral number of 1 to 5, namely, represents the number of F bonded to the aromatic ring.

Furthermore, among the substituent groups each represented by the above formula, especially, selected is preferably a substituent group represented by the following formula, that is, a benzyl group whose all 5 hydrogen atoms are substituted by fluorine atoms. The insulating polymer having such a chemical structure can exhibit a higher anti-hygroscopic property.

Further, in the insulating polymer having such a chemical structure, the fluorine atoms are bonded to the benzene ring (conjugate chemical structure). Therefore, in the chemical structure of the insulating polymer, electrons are biased towards the fluorine atoms. As a result, such an insulating polymer hardly extracts electrons from other adjacent molecules, that is, it has low electron attractive force from the organic semiconductor layer 30.

For this reason, in the case where the gate insulating layer 40 contains the above insulating polymer (especially, the gate insulating layer 40 is constituted from the above insulating polymer as the main component thereof), it is possible to more reliably prevent the conductibility from being imparted to the organic semiconductor layer 30.

[Formula 10]

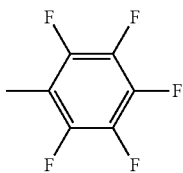

For example, the above mentioned insulating polymer can be obtained by condensing one kind of fluorine monomers represented by the following general formulas (GFM-1) and (GFM-2) and one kind of bisphenols represented by the following chemical formulas (BPM-1) and (BPM-2). In this regard, it is to be noted that the fluorine monomer is not limited to one represented by the general formulas (GFM-1) or (GFM-2), and the bisphenol is not also limited to one represented by the chemical formula (BPM-1) or (BPM-2).

[Formula 11]

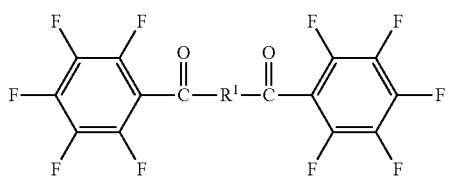
(GFM-1)

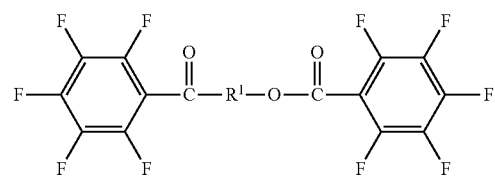
(GFM-2)

[Formula 12]

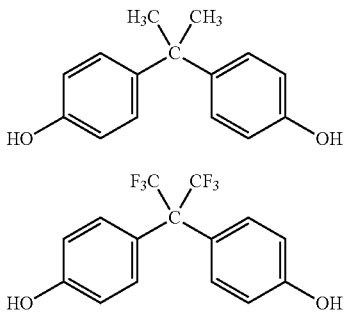
(BPM-1)
(BPM-2)

More specifically, examples of the insulating polymer include polymers represented by the following chemical formulas (A) to (C). Among them, the insulating polymer represented by the chemical formula (A) can be obtained by condensing a fluorine monomer represented by the following chemical formula (FM-1) and the bisphenol represented by the above chemical formula (BPM-1) in a predetermined feed ratio.

Likewise, the insulating polymer represented by the chemical formula (B) can be obtained by condensing a fluorine monomer represented by the following chemical formula (FM-2) and the bisphenol represented by the above chemical formula (BPM-1) in a predetermined feed ratio, and the insulating polymer represented by the chemical formula (C) can be obtained by condensing a fluorine monomer represented by the following chemical formula (FM-1) and the bisphenol represented by the above chemical formula (BPM-2) in a predetermined feed ratio.

Each of the insulating polymers represented by the chemical formulas (A) to (C) has chemical structures each derived from the fluorine monomer at both end portions of a main chain thereof. In other words, both ends of the main chain of each insulating polymer are terminated (substituted) by fluorine atoms (substuent groups each including fluorine atom(s)). In this regard, it is to be noted that the insulating polymer is not limited to one represented by the chemical formula (A), (B) or (C).

[Formula 13]

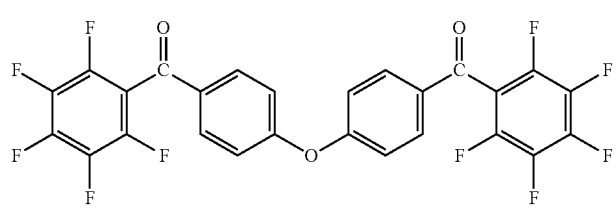
(FM-1)

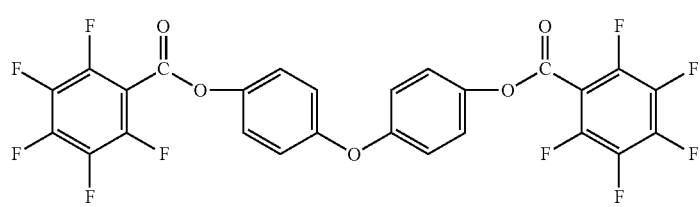
(FM-2)

[Formula 14]

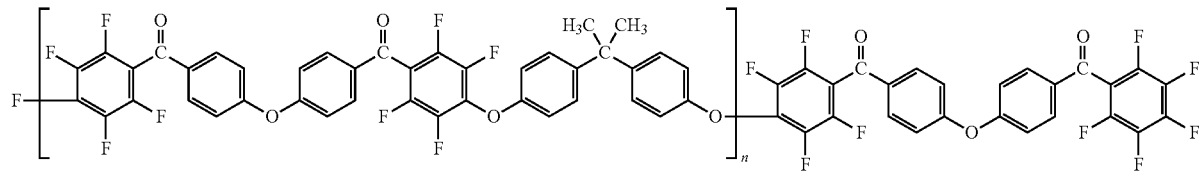

(A)

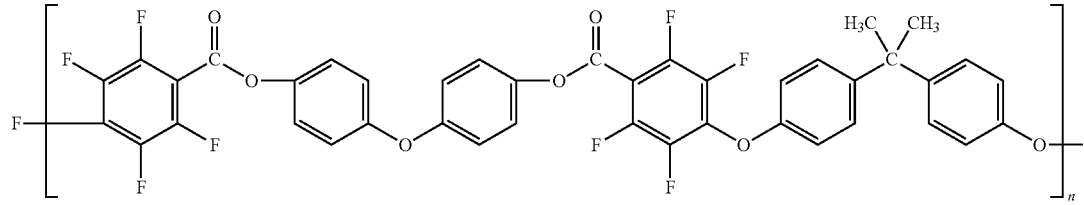

(B)

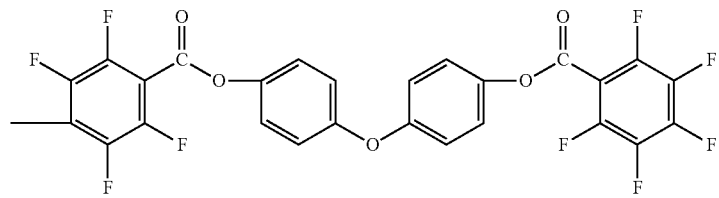

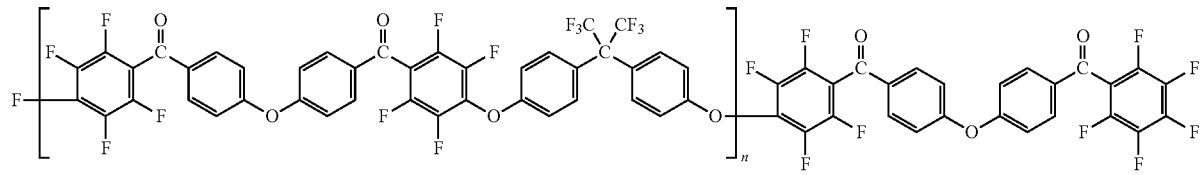

(C)

In this regard, in the case where a feed amount (mole number) of the fluorine monomer is defined as "A" and a feed amount (mole number) of the bisphenol is defined as "B" when being condensed, the feed ratio (mole ratio) of the fluorine monomer to the bisphenol "A/B" is preferably in the range of about 1.2/1 to 1/1, more preferably in the range of about 1.1/1 to 1/1, and even more preferably in the range of about 1.05/1 to 1/1.

By setting the feed ratio to a value within the above range, it is possible to more reliably adjust the theoretical phenol value of the insulating polymer to a value of 2.0 KOH mg/polymer g or less. Therefore, an insulating layer (thin film) formed using an insulating polymer obtained in the above feed ratio can exhibit an excellent insulating property.

On the other hand, if the feed ratio exceeds the above upper limit value, the number (mole number) of the fluorine monomer is oversupplied with respect to the number of the bisphenol. As a result, it becomes difficult to obtain an insulating polymer having a high molecular weight depending on reaction conditions or the like. Therefore, there is a case that mechanical strength (film strength) of the formed insulating layer is lowered.

Whereas if the feed ratio is less than the above lower limit value, the number of the bisphenol is oversupplied with respect to the number of the fluorine monomer. As a result, a plurality of phenolic hydroxyl groups (—OH) remain in the insulating polymer depending on reaction conditions or the like. Therefore, there is a case that the insulating polymer cannot exhibit a sufficient insulating property.

Next, description will be briefly made on a method of calculating the theoretical phenol value.

Further, description will be made a case that the bisphenol is oversupplied with respect to the fluorine monomer. Specifically, description will be made on a case that the feed ratio A/B is 1/1.025, that is, a case that 40 mol of the fluorine monomer and 41 mol of the bisphenol are reacted (condensed).

Hereinbelow, for convenience of description, the description will be representatively made on a case that the fluorine monomer represented by the chemical formula (FM-2) and the bisphenol represented by the chemical formula (BPM-1) are condensed.

In this case, if it is hypothesized that all the fluorine monomer and the bisphenol are condensed, as shown in the following chemical formula, it becomes possible to obtain an insulating polymer having a main chain whose both ends are terminated by phenolic hydroxyl groups (—OH).

[Formula 15]

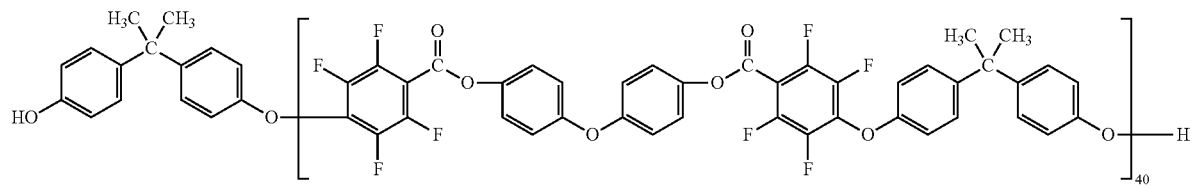

A molecular weight of each unit (repeating unit) included in such an insulating polymer is 746, and a molecular weight of the insulating polymer itself is 30,048. Since the theoretical phenol value indicates the number (amount) of phenolic hydroxyl groups (—OH) per 1 g of a polymer in KOH equivalent, it can be calculated based on (a valence (the number of the phenolic hydroxyl groups)/the molecular weight of the insulating polymer)×(the weight of 1 mol of KOH).

Therefore, the phenol value of the insulating polymer represented by the above chemical structure is indicated as an equation of (2/30,048)×56.1 to thereby obtain 3.73 KOH mg/polymer g. In this regard, since this obtained value does not fall within the above preferable range (that is, it exceeds the above upper limit value), an insulating layer (thin film) formed using such an insulating polymer exhibits a slight inferior anti-hygroscopic property and insulating property.

Next, description will be made a case that the amount of the bisphenol is equal to the amount of the fluorine monomer, that is, a case that the feed ratio A/B is 1/1. Hereinbelow, for convenience of description, the description will be representatively made on a case that the fluorine monomer represented by the chemical formula (FM-1) and the bisphenol represented by the chemical formula (BPM-1) are condensed.

In this case, by condensing the fluorine monomer and the bisphenol, as shown in the following chemical formula, it becomes possible to obtain an insulating polymer having a main chain whose one end is terminated by a phenolic hydroxyl group (—OH) and the other end is terminated by a fluorine atom.

hydroxyl groups do not exist, namely the number of the phenolic hydroxyl groups is 0 (zero), the phenol value of the insulating polymer also becomes 0 (zero).

—Method of Manufacturing Active Matrix Device—

Next, description will be made on a method of manufacturing the active matrix device 300.

In this regard, it is to be noted that, hereinbelow, a method of producing the thin film transistor 1 (the method of the present invention) will be mainly described.

Figure 3:
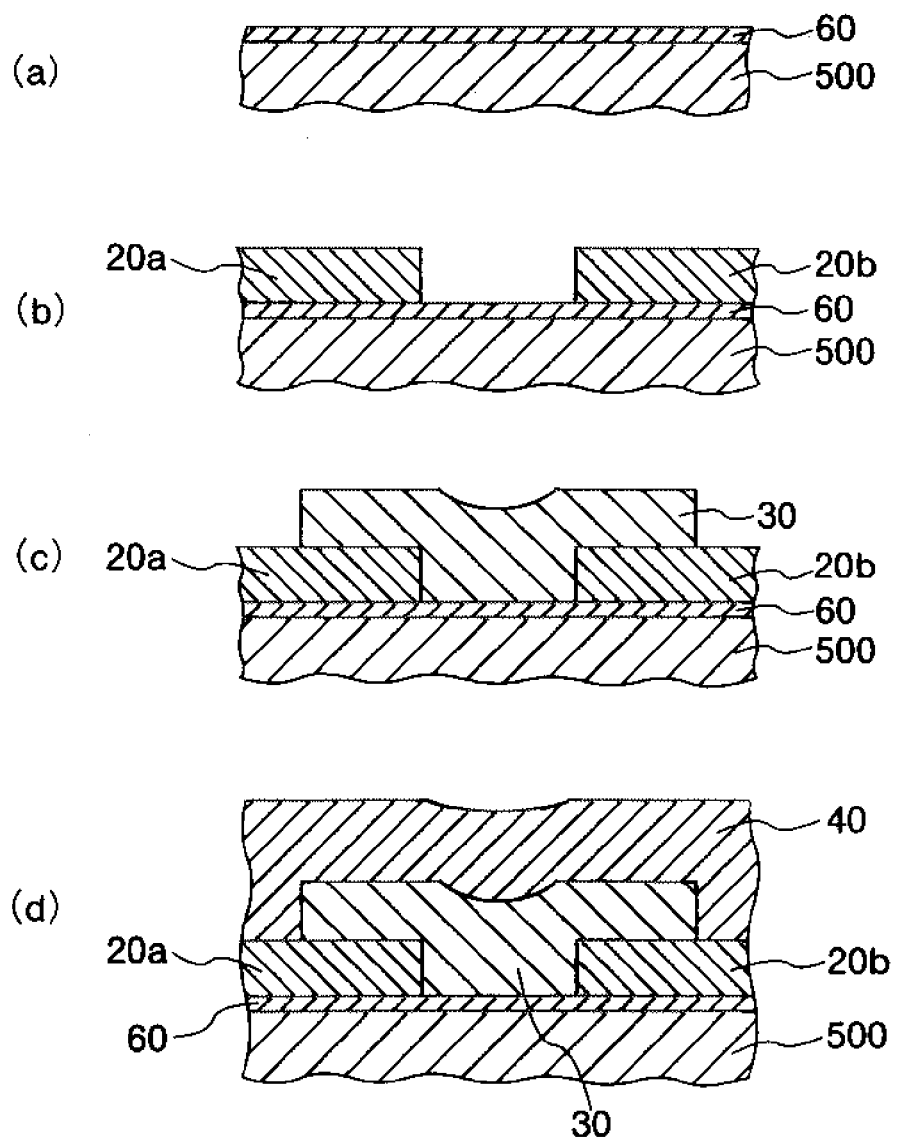
FIGS. 3(a) to 3(d) are vertical section views each showing a step of producing the organic semiconductor element shown in FIGS. 2(a) and 2(b).

[1] Buffer Layer Forming Step (See FIG. 3(*a*))

First, the substrate 500 is prepared, and then the buffer layer 60 is formed on the substrate 500.

The buffer layer 60 can be formed, for example, through a liquid phase process in which a solution prepared by dissolving the above mentioned insulating polymer is dissolved into a solvent onto the substrate 500, and then the solvent is removed from the solution.

Examples of the solvent to be used for preparing the solution include various organic solvents such as a ketone-based solvent (e.g., methyl ethyl ketone (MEK), acetone, diethyl ketone, methyl isobutyl ketone (MIBK), methyl isopropyl ketone (MIPK) or cyclohexanone), an alcohol-based solvent (e.g., methanol, ethanol, isopropanol, ethylene glycol, diethylene glycol (DEG) or glycerine), an ether-based solvent (e.g., diethyl ether, diisopropyl ether, 1,2-dimethoxy ethane (DME), 1,4-dioxane, tetrahydrofuran (THF), tetrahydropyran (THP), anisole, diethylene glycol dimethyl ether (diglyme) or diethylene glycol ethyl ether (Carbitol)), an ester-based solvent (e.g., methyl acetate, ethyl acetate, buthyl

[Formula 16]

In this case, a number average molecular weight "Mn" of the insulating polymer obtained by condensing the fluorine monomer and the bisphenol can be determined using a penetration chromatographic analysis (GPC). In the case where the determined number average molecular weight "Mn" is 38,000, the phenol value of the insulating polymer is indicated as an equation of (1/38,000)×56.1 to thereby obtain 1.48 KOH mg/polymer g.

Next, description will be made a case that the fluorine monomer is oversupplied with respect to the bisphenol. In this case, it becomes possible to obtain an insulating polymer having a main chain whose both ends are terminated by fluorine atoms, as shown in the above chemical formula (A), (B) or (C). Since in such an insulating polymer, phenolic acetate or ethyl formate), a cellosolve-based solvent (e.g., methyl cellosolve, ethyl cellosolve and phenyl cellosolve), an aliphatic hydrocarbon-based solvent (e.g. hexane, pentane, heptane or cyclohexane), an aromatic hydrocarbon-based solvent (e.g., toluene, xylene, benzene, trimethyl benzene or tetramethyl benzene), an aromatic heterocyclic compound-based solvent (e.g., pyridine, pyrazine, furan, pyrrole, thiophene or methyl pyrrolidone), an amide-based solvent (e.g., N,N-dimethyl formamide (DMF) or N,N-dimethyl acetamide (DMA)), a halogen compound-based solvent (e.g., dichloromethane, chloroform or 1,2-dichloroethane), a sulfur compound-based solvent (e.g., dimethyl sulfoxide (DMSO) or sulfolane), a nitrile-based solvent (e.g., acetonitrile, propionitrile or acrylonitrile), an organic acid-based solvent (e.g., formic acid, acetic acid, trichloroacetic acid or trifluoroacetic acid), a mixed solvent containing at least one of them, and the like.

Further, examples of a method of applying the solution onto the substrate 500 include a spin coating method, a casting method, a micro gravure coating method, a gravure coating method, a bar coating method, a roll coating method, a wire-bar coating method, a dip coating method, a spray coating method, a screen printing method, a flexographic printing method, an offset printing method, an ink-jet method, a micro-contact printing method, and the like. One of these methods may be used independently or two or more of these methods may be used in combination.

For example, as a method of removing the solvent from the solution, an air drying method, a vacuum drying method, a drying method by heating, a drying method by blowing gas (e.g., inert gas) and the like can be used.

[2] Source and Drain Electrodes Forming Step (See FIG. 3(b))

Next, the source electrode 20a and the drain electrode 20b are formed on the buffer layer 60 at a predetermined distance.

First, a metal film (metal layer) is formed on the buffer layer 60. The metal film can be formed using, for example, a dry plating method such as a chemical vapor deposition (CVD) method (e.g., a plasma CVD method, a thermal CVD method or a laser CVD method), a vacuum deposition, a sputtering method or an ion plating method, a wet plating method such as an electrolytic plating method, an immersion plating method or an electroless plating method, a thermal spraying method, a sol-gel method, a MOD method, a metallic foil bonding method, or the like.

A resist material is applied onto the metal film, and then cured to thereby form a resist layer having a shape corresponding to that of each of the source electrode 20a and the drain electrode 20b. Using the resist layer as a mask, an unnecessary portion of the metal film is removed.

Examples of a method of removing the metal film include a physical etching method such as a plasma etching method, a reactive ion etching method, a beam etching method or a photo assist etching method, a chemical etching method such as a wet etching method and the like. One of these etching methods may be used independently or two or more of these etching methods may be used in combination.

Thereafter, by removing the resist layer, the source electrode 20a and the drain electrode 20b can be obtained.

In this regard, it is to be noted that each of the source electrode 20a and the drain electrode 20b may be also formed by applying a conductive material containing conductive particles onto the buffer layer 60 and drying the conductive material to form a liquid coating, and then subjecting, if needed, a post treatment such as a heating treatment, an infrared radiation exposure treatment or an ultrasonic sound imparting treatment to the liquid coating.

As a method of applying the conductive material onto the buffer layer 60, the method described in the step [1] can be used.

Further, at this timing, the data lines 301 and the pixel electrodes are also formed.

[3] Organic Semiconductor Layer Forming Step (See FIG. 3(c))

Next, the organic semiconductor layer 30 is formed so as to make contact with the source electrode 20a and the drain electrode 20b.

The organic semiconductor layer 30 can be formed by applying a solution containing an organic semiconductor material or a precursor thereof on a predetermined region of the buffer layer 60 including a region between the source electrode 20a and the drain electrode 20b and drying the solution to form a liquid coating, and then subjecting, if needed, a post treatment such as a heating treatment, an infrared radiation exposure treatment or an ultrasonic sound imparting treatment to the liquid coating.

In this regard, it is to be noted that, as a method of applying the solution onto the buffer layer 60, the method described in the step [1] can be used.

[4] Gate Insulating Layer Forming Step (See FIG. 3(d))

Next, the gate insulating layer 40 is formed so as to cover the source electrode 20a, the drain electrode 20b and the organic semiconductor layer 30.

The gate insulating layer 40 can be formed through the liquid phase process like the buffer layer 60.

According to the liquid phase process, it is possible to prevent unnecessary heat from being imparted to the organic semiconductor layer 30. This makes it possible to appropriately prevent lowering of the property of the organic semiconductor layer 30 which would cause lowering of the property of the thin film transistor 1.

In this case, for preparing the solution, selected is a solvent which does not take up or swell the organic semiconductor layer 30. As such a solvent, it is especially preferable to use one containing at least one of the ketone-based solvent and the ester-based solvent as a main component thereof, among the solvents described in the step [1].

In this regard, since the insulating polymer with the main chain including repeating units represented by the general formula (1) or (2) includes the fluorinated benzene rings and the carbonyl groups (or ester groups), it can be sufficiently dissolved into a solvent having relatively high polarity such as the ketone-based solvent or the ester-based solvent.

Figure 4:
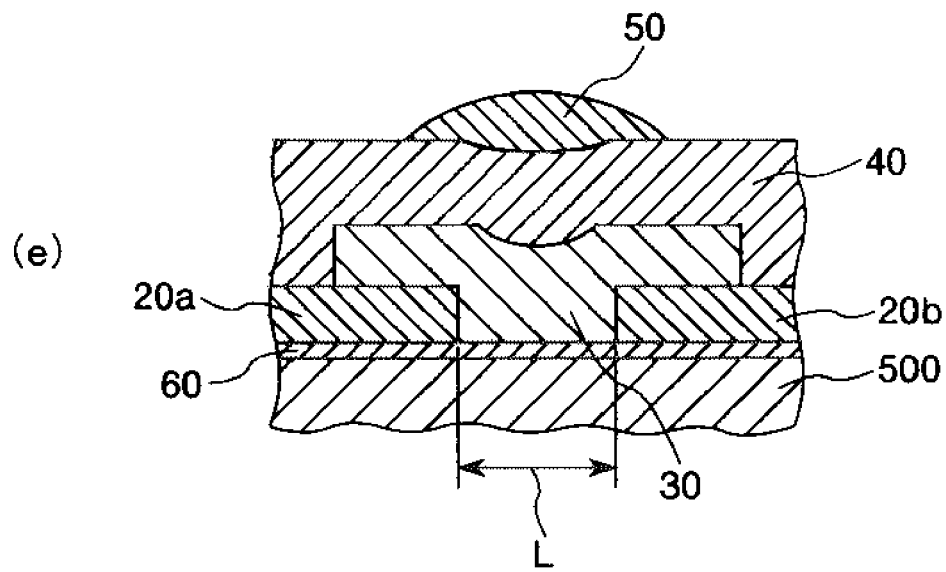
FIGS. 4(e) and 4(f) are vertical section views each showing a step of producing the organic semiconductor element shown in FIGS. 2(a) and 2(b).
Figure 4:
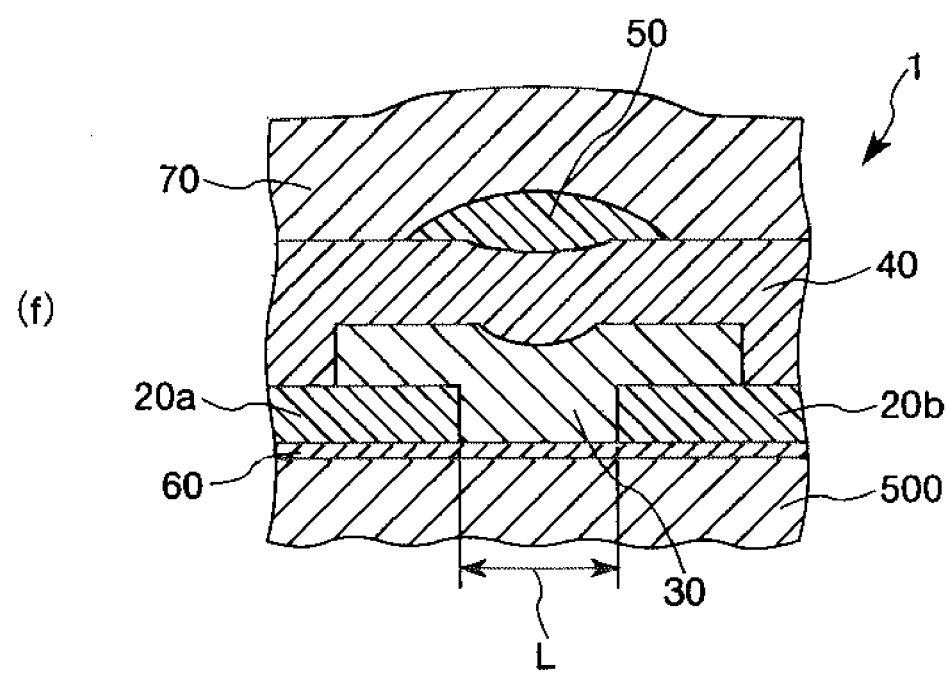

[5] Gate Electrode Forming Step (See FIG. 4(e))

Next, the gate electrode 50 is formed on the gate insulating layer 40 so as to correspond to the region between the source electrode 20a and the drain electrode 20b.

The gate electrode 50 can be formed in the same manner as used for forming the source electrode 20a and the drain electrode 20b.

It is preferred that the gate electrode 50 is formed through a liquid phase process using an electrode forming material (conductive material) such as a dispersion liquid containing PEDOT/PSS (conductive polymer) or a dispersion liquid containing metal particles (e.g., silver colloid or copper colloid).

According to the liquid phase process, by applying the electrode forming material onto the gate insulating layer 40 using an ink-jet method, it is possible to easily form a gate electrode 50 having high dimensional accuracy.

In this regard, since such an electrode forming material is prepared using a water-based dispersion medium, various kinds of ions are often dissolved into the water-based dispersion medium as impurities, eluted elements derived from the metal particles or the like.

In the case where the gate insulating layer 40 is constituted from the above insulating polymer having high ant-hygroscopic property (low hygroscopic property) as the main component thereof, it is possible to prevent diffusion of the ions into the gate insulating layer 40.

This makes it possible to suppress disadvantages which would occur due to diffusion of the ions into the gate insulating layer 40 (e.g., generation of ion current or dielectric breakdown), thereby maintaining the property of the thin film transistor 1 for a long period of time.

Further, at this timing, the scanning lines 302 are formed.

In this embodiment, the scanning lines 302 are formed so as to be separated from the gate electrodes 50 of the thin film transistors 1. However, the gate electrodes 50 of the adjacent thin film transistors 1 may be integrally formed to make a single scanning line 302.

[6] Protective Layer Forming Step (See FIG. 3(f))

Next, the protective layer 70 is formed on the gate insulating layer 40 so as to the gate electrode 50.

The protective layer 70 can be formed in the same manner as used for, forming the organic semiconductor layer 30.

<Electronic Device>

Next, description will be made on an electrophoretic display device, in which the above mentioned active matrix device is provided, as one example of an electronic device according to the present invention.

Figure 5:
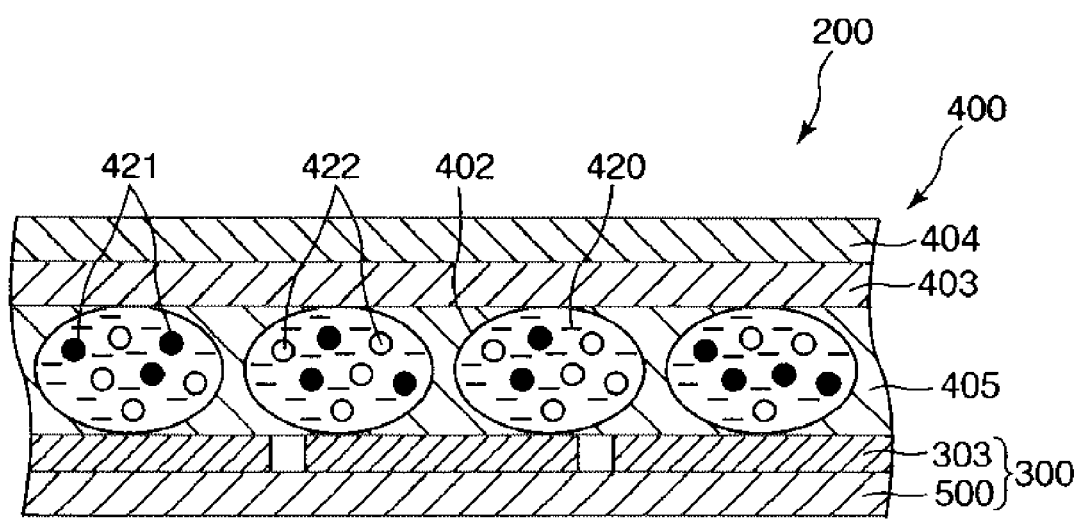
FIG. 5 is a vertical section view showing an embodiment in which an electronic device according to the present invention is used in an electrophoretic display device.

FIG. 5 is a vertical section view showing an embodiment in which an electronic device according to the present invention is used in an electrophoretic display device. In this regard, it is to be noted that the upper side in FIG. 5 will be referred to as "upper" and the lower side therein will be referred to as "lower" in the following description.

The electrophoretic display device 200 shown in FIG. 5 includes the above mentioned active matrix device 300 and an electrophoretic display portion 400 provided on the active matrix device 300.

This electrophoretic display portion 400 includes a transparent substrate 404 provided with a transparent electrode (common electrode) 403 and microcapsules 402 secured to the transparent electrode 403 through a binder material 405.

The active matrix device 300 is bonded to the electrophoretic display portion 400 so that microcapsules 402 make contact with the pixel electrodes 303.

An electrophoretic dispersion liquid 420 containing various kinds of electrophoretic particles having different properties (in this embodiment, two kinds of electrophoretic particles 421 and 422 having different charges and colors (hues)) is encapsulated into each of the microcapsules 402.

In such an electrophoretic display device 200, if selection signals (selection voltages) are applied to one or more scanning lines 302, each of the thin film transistors 1 connected to the scanning lines 302 to which the selection signals (selection voltages) are applied becomes an ON state.

This provides substantial conduction between the data lines 301 and the corresponding pixel electrodes 303 which are connected to the thin film transistors 1. At this time, if predetermined data signals (voltages) are applied to the data lines 301, they are applied to the pixel electrodes 303.

When the data signals are applied to the pixel electrodes 303, electrical fields are generated between the pixel electrodes 303 and the transparent electrode 403. As a result, the electrophoretic particles 421 and 422 electrophoretically move toward the pixel electrodes 303 or the transparent electrode 403 depending on directions and/or intensities of the electrical fields, the properties of the electrophoretic particles 421 and 422 and the like.

On the other hand, form this state, the application of the selection signals (selection voltages) to the scanning lines 302 is stopped, each of the thin film transistors 1 becomes an OFF state. This makes non-conduction between the data lines 301 and the corresponding pixel electrodes 303 which are connected to the thin film transistors 1.

Therefore, by appropriately combining the application of the selection signals to the scanning lines 302 and the stoppage thereof or the application of the data signals to the data lines 301 and the stoppage thereof, a desired image (information) can be displayed at a side of a display surface (transparent substrate 404) of the electrophoretic display device 200.

Especially, in the electrophoretic display device 200 of this embodiment, the colors of the electrophoretic particles 421 and 422 are different from each other. This makes it possible to display an image having multiple gray scales.

Further, since the electrophoretic display device 200 of this embodiment includes the active matrix device 300, an ON/OFF state of a thin film transistor 1 connected to a specific scanning line 302 can be selectively switched. Therefore, crosstalk hardly occurs and circuit drive can be speeded up. This makes it possible to obtain an image (information) having a high quality.

Further, since the electrophoretic display device 200 of this embodiment can be driven at low drive voltage, it is possible to achieve energy-saving thereof.

In this regard, it is to be noted that a display device, in which the above mentioned active matrix device provided with the thin film transistors 1 is used, is not limited to be utilized for constituting such an electrophoretic display device 200, but can be utilized for constituting a crystalline liquid display device or the like.

<Electronic Equipment>

Such an electrophoretic display device 200 can be utilized for constituting various kinds of electronic equipment. Hereinbelow, description will be made on the electronic equipment of the present invention provided with the electrophoretic display device 200.

<<Electronic Paper>>

First, description will be offered regarding an embodiment in which the electronic apparatus of the present invention is used in an electronic paper.

Figure 6:
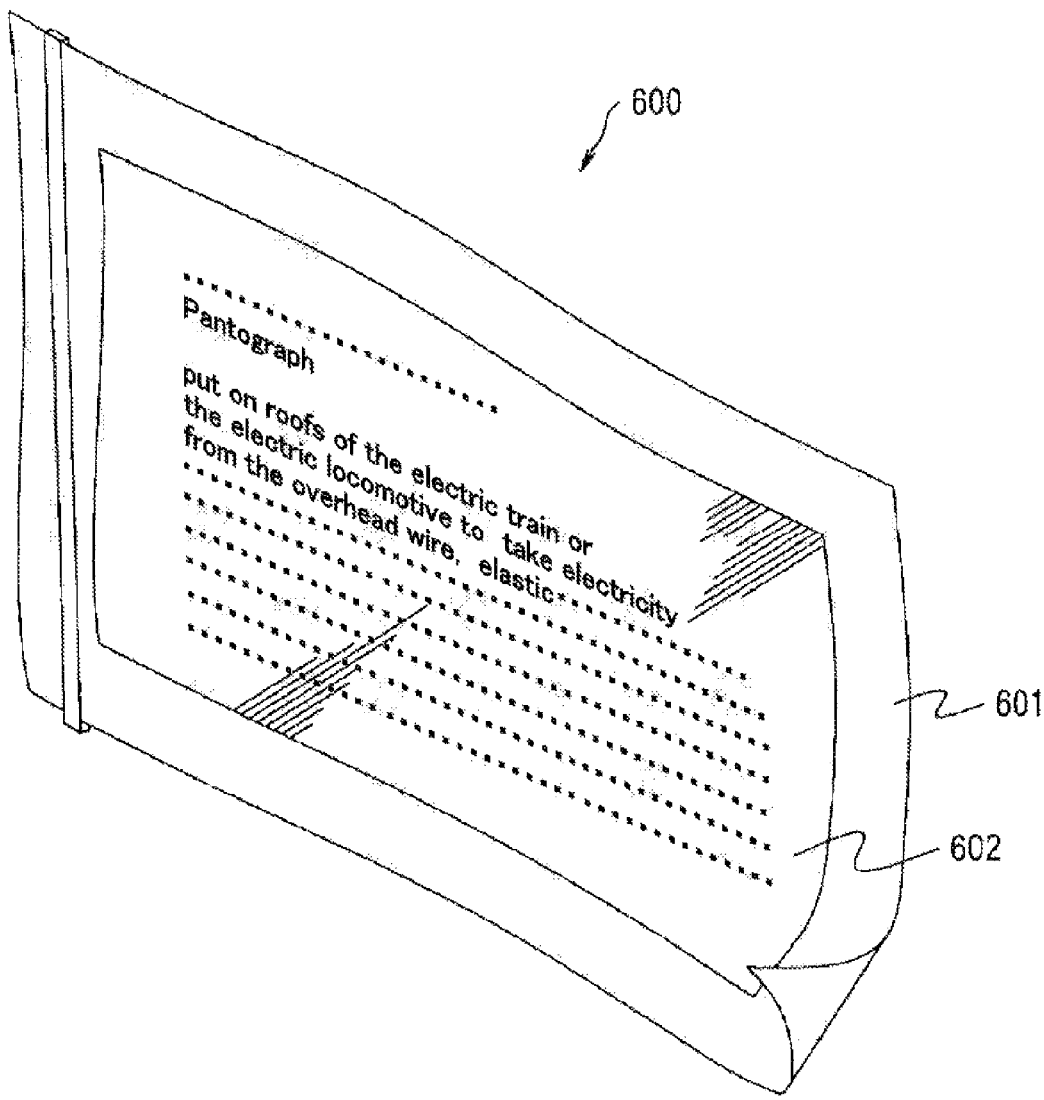
FIG. 6 is a perspective view showing an embodiment in which an electronic apparatus according to the present invention is used in an electronic paper.

FIG. 6 is a perspective view showing the embodiment in which the electronic apparatus according to the present invention is used in the electronic paper.

The electronic paper 600 shown in FIG. 6 includes a main body 601 formed of a rewritable sheet having the same texture and flexibility as that of a paper sheet, and a display unit 602 attached to the main body 601.

In the electronic paper 600, the display unit 602 is formed from the electrophoretic display device 200 described above.

<<Display Apparatus>>

Next, description will be offered regarding an embodiment in which the electronic apparatus of the present invention is used in a display apparatus.

Figure 7:
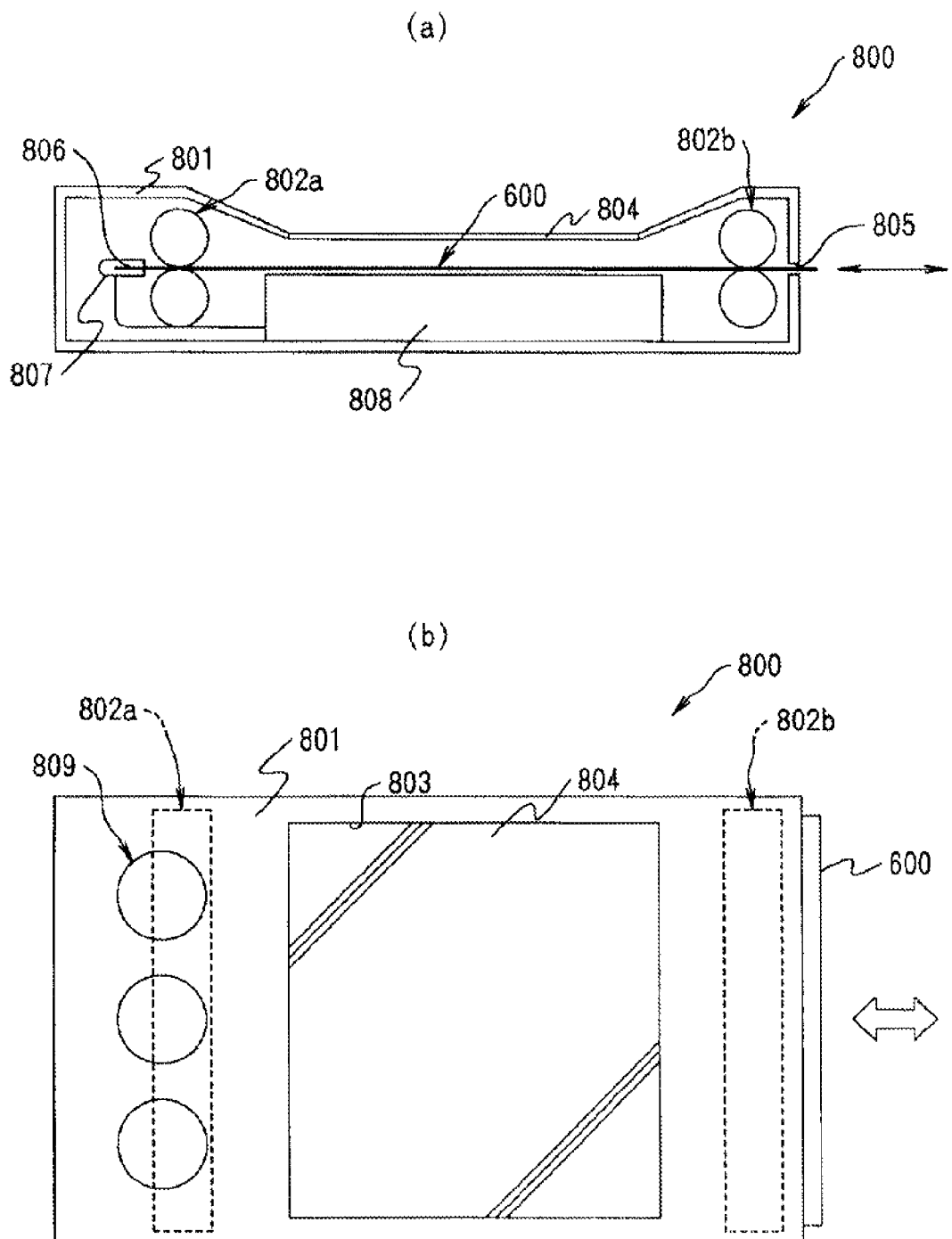
FIGS. 7(a) and 7(b) are section and plan views showing an embodiment in which an electronic apparatus according to the present invention is used in a display apparatus.

FIGS. 7(a) and 7(b) are section and plan views each showing an embodiment in which the electronic apparatus according to the present invention is used in the display apparatus.

The display apparatus 800 shown in FIGS. 7(a) and 7(b) includes a main body portion 801 and an electronic paper 600 detachably attached to the main body portion 801. In this regard, it is to be noted that the electronic paper 600 is of the same configuration as set forth above, i.e., the same configuration as shown in FIG. 6.

Formed on one lateral side (the right side in FIG. 7(a)) of the main body portion 801 is an insertion slot 805 through which the electronic paper 600 can be inserted. Two pairs of conveying rollers 802a and 802b are provided within the main body portion 801. When the electronic paper 600 is inserted into the main body portion 801 through the insertion slot 805, the electronic paper 600 is held within the main body portion 801 in a state that it is gripped by means of the pairs of conveying rollers 802a and 802b.

Further, a rectangular opening 803 is formed on a display surface side (the front side in FIG. 7(b)) of the main body portion 801 and a transparent glass plate 804 is fitted to the rectangular opening 803. This allows the electronic paper 600 held within the main body portion 801 to be visually recognized from the outside of the main body portion 801. In other words, the display apparatus 800 has a display surface that allows the electronic paper 600 held within the main body portion 801 to be visually recognized through the transparent glass plate 804.

Furthermore, a terminal portion 806 is formed in a leading edge portion (the left side in FIGS. 7(a) and 7(b)) of the electronic paper 600. Provided within the main body portion 801 is a socket 807 that makes contact with the terminal portion 806 when the electronic paper 600 is placed within the main body portion 801. A controller 808 and an operation part 809 are electrically connected to the socket 807.

In the display apparatus 800 set forth above, the electronic paper 600 is removably fitted to the main body portion 801 and is portable in a state that it is removed from the main body portion 801.

Further, the electronic paper 600 of the display apparatus 800 is formed from the electrophoretic display device 200 described above.

In this regard, it is to be noted that the electronic apparatus of the present invention is not limited to the uses as described above. Examples of other uses of the electronic apparatus include a television set, a viewfinder type or monitor viewing type video tape recorder, a car navigation system, a pager, a personal digital assistance, an electronic calculator, an electronic newspaper, a word processor, a personal computer, a workstation, a picture phone, a POS terminal, a device provided with a touch panel and the like. The display device 200 of the present invention can be used in display parts of the various kinds of electronic apparatuses described above.

While the organic semiconductor element, the method of manufacturing the organic semiconductor element, the electronic device, the electronic equipment and the insulating layer forming composition according to the present invention have been described hereinabove based on the illustrated embodiments, the present invention is not limited thereto.

Although in the embodiment, the description is representatively made on the case that the thin film transistor 1 has the top gate structure, the thin film transistor 1 may have a bottom gate structure in which the gate electrode 50 is positioned closer to the substrate 500 than the source electrode 20a and the drain electrode 20b.

EXAMPLES

Example A

First, each of the following polymers (AA) to (AI) was prepared as an insulating polymer.

[Formula 17]

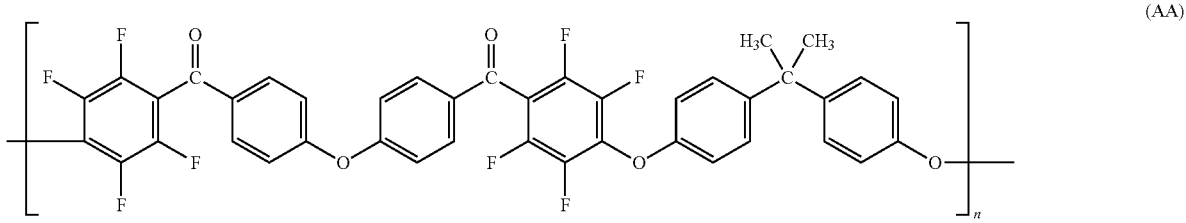

(AA)

[Formula 18]

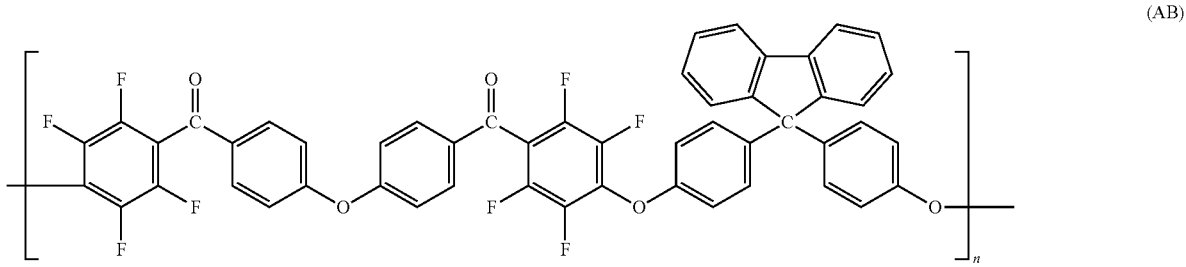

(AB)

[Formula 19]

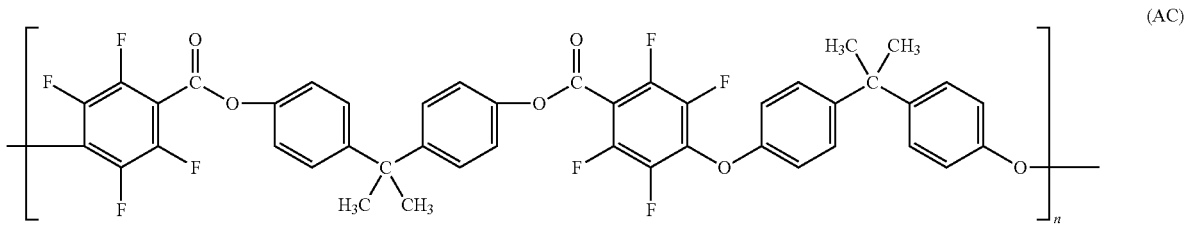

(AC)

[Formula 20]
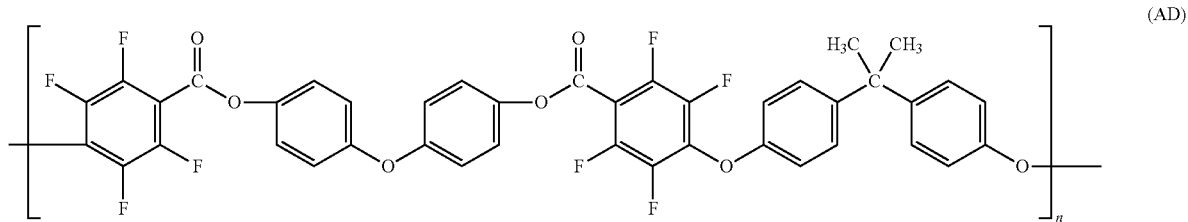
(AD)
[Formula 21]
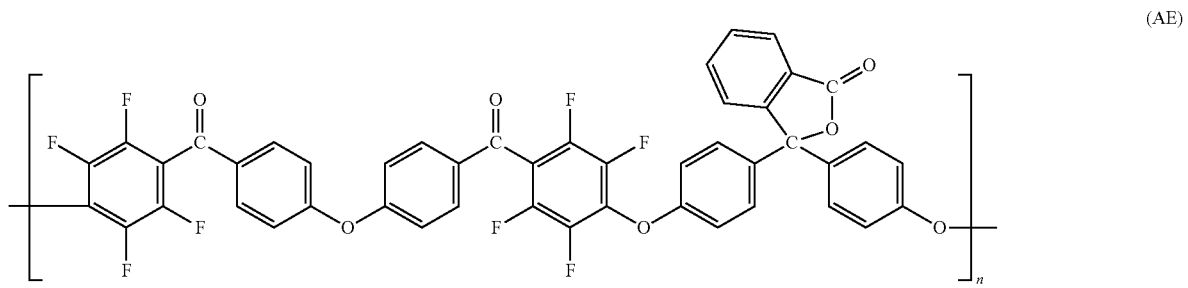
(AE)
[Formula 22]
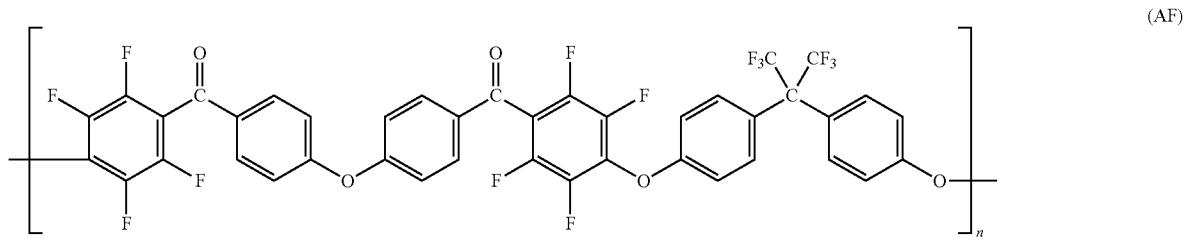
(AF)
[Formula 23]
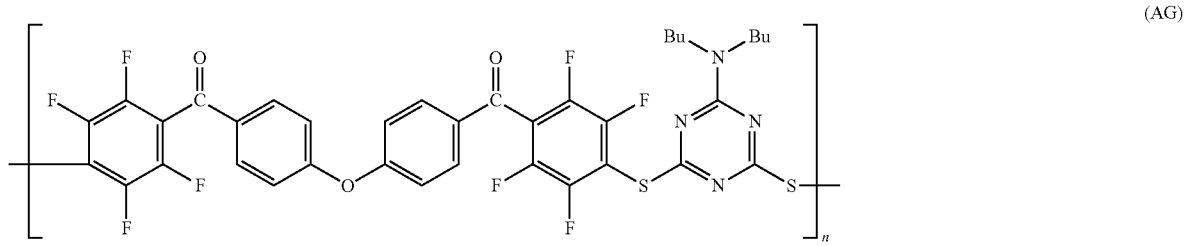
(AG)
[Formula 24]
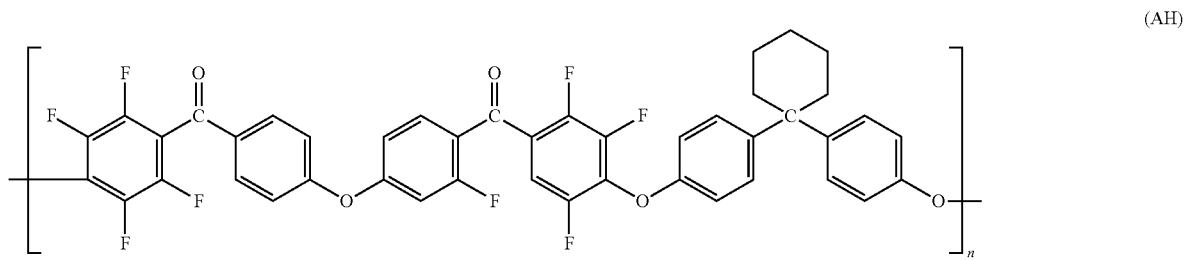
(AH)

[Formula 25]

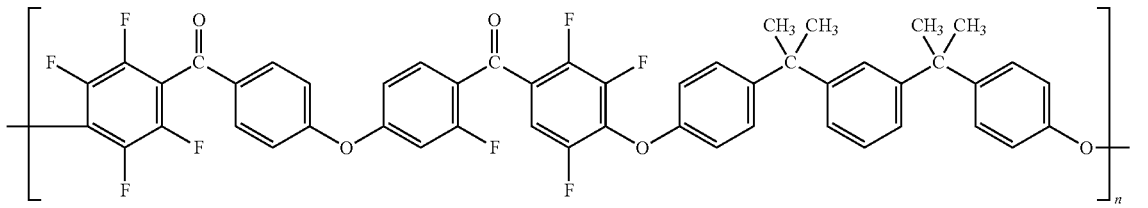

(AI)

<Preparation of Polymers (AA) to (AI)>

The polymer (AA) was obtained as follows.

First, 15.45 g (27.7 mmol) of bis(2,3,4,5,6-pentafluorobenzoyl)diphenyl ether (hereinbelow, abbreviated as "BPDE"), 6.16 g (27 mmol) of bisphenol A (hereinbelow, abbreviated as "BisA"), 11.17 g (80.8 mmol) of potassium carbonate, 6.8 g of molecular sieve and 81 g of methyl ethyl ketone were mixed, and then reacted for 7 hours at 79° C. to obtain a polymer solution.

Thereafter, the polymer solution was diluted by butyl acetate and filtrated, and then washed with deionized water in a separatory funnel. Finally, the washed polymer solution was evaporated to thereby obtain the polymer (AA).

The polymer (AB) was obtained as follows.

First, 16.75 g of BPDE, 10.50 g of bisphenol fluorene, 4.55 g of potassium carbonate, 5.4 g of molecular sieve and 90 g of dimethyl acetoamide were mixed, and then reacted for 8 hours at 80° C. to obtain a polymer solution. Thereafter, the polymer solution was diluted by acetone and filtrated, and then the filtrated polymer solution was added to deionized water to reprecipitate a solid.

Next, the reprecipitated solid was filtrated and dried. Finally, a reprecipitation process, in which the reprecipitated solid was once again dissolved into acetone and the acetone was added to deionized water, was repeated two times to thereby obtain the polymer (AB).

The polymer (AC) was obtained as follows.

First, 15.0 g of 2,2-bis(2,3,4,5,6-pentafluorobenzoyl oxyphenyl)propane (hereinbelow, abbreviated as "ester BisA"), 5.56 g of BisA, 10.09 g of potassium carbonate, 7 g of molecular sieve and 110 g of MEK were mixed, and then reacted for 6.5 hours at 79° C. to obtain a polymer solution.

Thereafter, the polymer solution was diluted by butyl acetate and filtrated, and then washed with deionized water in a separatory funnel. Next, the washed polymer solution was evaporated and added to methanol to reprecipitate a solid. Finally, the reprecipitated solid was filtrated and dried to thereby obtain the polymer (AC).

The polymer (AD) was obtained as follows.

First, 12.1 g of 2,2-bis(2,3,4,5,6-pentafluorobenzoyl oxy) diphenyl ether (hereinbelow, abbreviated as "ester DE"), 4.56 g of BisA, 5.53 g of potassium carbonate, 7 g of molecular sieve and 90 g of methyl ethyl ketone were mixed, and then reacted for 7.5 hours at 79° C. to obtain a polymer solution.

Thereafter, the polymer solution was diluted by butyl acetate and filtrated, and then washed with deionized water in a separatory funnel. Finally, the washed polymer solution was evaporated to thereby obtain the polymer (AD).

The polymer (AE) was obtained as follows.

First, 11.17 g of BPDE, 6.37 g of phenolphthalein, 8.29 g of potassium carbonate, 5.0 g of molecular sieve and 85 g of MEK were mixed, and then reacted for 6.5 hours at 79° C. to obtain a polymer solution. Thereafter, the polymer solution was diluted by butyl acetate and filtrated, and then washed with deionized water in a separatory funnel.

Next, the washed polymer solution was evaporated and added to methanol to reprecipitate a solid. Finally, the reprecipitated solid was filtrated and dried to thereby obtain the polymer (AE).

The polymer (AF) was obtained as follows.

First, 16.75 g of BPDE, 10.08 g of 2,2-dihydroxyphenyl hexafluoropropane (hereinbelow, abbreviated as "BisAF"), 4.55 g of potassium carbonate, 5.4 g of molecular sieve and 90 g of dimethyl acetoamide were mixed, and then reacted for 6 hours at 60° C. to obtain a polymer solution. Thereafter, the polymer solution was diluted by acetone and filtrated, and then the filtrated polymer solution was added to deionized water to reprecipitate a solid.

Next, the reprecipitated solid was filtrated and dried. Finally, a reprecipitation process, in which the reprecipitated solid was once again dissolved into acetone and the acetone was added to deionized water, was repeated two times to thereby obtain the polymer (AF).

The polymer (AG) was obtained as follows.

First, 16.75 g of BPDE, 8.17 g of 2-dibuthyl amino-4,6-dimercapto-s-triazine ("Zisnet DB" produced by SANKYO KASEI Co., Ltd.), 4.35 g of potassium carbonate, 5.4 g of molecular sieve and 60 g of dimethyl acetoamide were mixed, and then reacted for 2 hours at 60° C. to obtain a polymer solution. Thereafter, the polymer solution was diluted by acetone and filtrated, and then the filtrated polymer solution was added to deionized water to reprecipitate a solid.

Next, the reprecipitated solid was filtrated and dried, and then dissolved into acetone once again. Finally, the acetone was added to deionized water to reprecipitate a solid, and then the solid was filtrated and dried to thereby obtain the polymer (AG).

The polymer (AH) was obtained as follows.

First, 16.75 g of BPDE, 8.05 g of BisZ, 4.56 g of potassium carbonate and 75 g of dimethyl acetamide were mixed, and then reacted for 6 hours at 80° C. to obtain a polymer solution. Thereafter, the polymer solution was diluted by acetone and filtrated, and then added to deionized water to reprecipitate a solid.

Next, the solid was dissolved into butyl acetate to obtain a polymer solution, and then the polymer solution was washed with deionized water in a separatory funnel. Finally, the washed polymer solution was evaporated to thereby obtain the polymer (AH).

The polymer (AI) was obtained as follows.

First, 15.07 g of BPDE, 9.35 g of 1,3-bis[2-(4-hydroxyphenyl)-2-propyl]benzene, 4.10 g of potassium carbonate and 65 g of dimethyl acetamide were mixed, and then reacted for 5.5 hours at 65° C. to obtain a polymer solution. Thereafter, the polymer solution was diluted by acetone and filtrated, and then the filtrated polymer solution was added to deionized water to reprecipitate a solid.

Next, the reprecipitated solid was filtrated and dried, and then dissolved into acetone once again. Finally, the acetone was added to deionized water to reprecipitate a solid, and then the solid was filtrated and dried to thereby obtain the polymer (AI).

2. Manufacture of Thin Film Transistor 200 thin film transistors were manufactured in each of Examples A1 to A14 and Comparative Examples A1 to A9. Each of the thin film transistors was manufactured as follows.

Example A1

First, a glass substrate ("OA10" produced by NEC Corning Inc.) was prepared, washed with water and then dried.

Next, a gold thin film was formed onto the glass substrate using a vacuum deposition method. Thereafter, a resist layer was formed onto the gold thin film so as to correspond to a shape of each of a source electrode and a drain electrode, and then the gold thin film was etched using the resist layer as a mask. In this way, obtained were the source electrode and the drain electrode each having an average thickness of 100 nm.

Next, a 1 wt % toluene solution of F8T2 (produced by ADS, Inc.) which was a derivative of fluorine-bithiophene copolymer was applied onto the glass substrate on which the source electrode and the drain electrode were formed using a spin coating method, and then dried for 10 minutes at 60° C. In this way, an organic semiconductor layer having an average thickness of 50 nm was obtained.

Next, a 5 wt % butyl acetate solution of the polymer (AA) was applied so as to cover the organic semiconductor layer, the source electrode and the drain electrode using a spin coating method, and then dried for 10 minutes at 60° C. In this way, a gate insulating layer having an average thickness of 500 nm was obtained.

Next, a water dispersion liquid of Ag particles was applied onto the gate insulating layer so as to correspond to a region between the source electrode and the drain electrode using an ink-jet method, and then dried for 10 minutes at 80° C. In this way, a gate electrode having an average thickness of 100 nm and an average width of 3 μm was obtained.

In the manufactured thin film transistor, a difference between Vth in nitrogen gas and Vth in air (ΔVth=Vth (air)−Vth ($N_2$)) was −2 [V]. In Table 1 below, a case that the water dispersion liquid of Ag particles was used when forming the gate electrode is indicated as "Ag-IJ".

Example A2

A thin film transistor was manufactured in the same manner as Example A1 except that the polymer (AB) was used instead of the polymer (AA) when forming the gate insulating layer. In this regard, it is to be noted that ΔVth of the thin film transistor was −5 [V].

Example A3

A thin film transistor was manufactured in the same manner as Example A1 except that the polymer (AC) was used instead of the polymer (AA) when forming the gate insulating layer. In this regard, it is to be noted that ΔVth of the thin film transistor was −3 [V].

Example A4

A thin film transistor was manufactured in the same manner as Example A1 except that the polymer (AD) was used instead of the polymer (AA) when forming the gate insulating layer. In this regard, it is to be noted that ΔVth of the thin film transistor was −3 [V].

Example A5

A thin film transistor was manufactured in the same manner as Example A1 except that the polymer (AE) was used instead of the polymer (AA) when forming the gate insulating layer.

Example A6

A thin film transistor was manufactured in the same manner as Example A1 except that the polymer (AF) was used instead of the polymer (AA) when forming the gate insulating layer.

Example A7

A thin film transistor was manufactured in the same manner as Example A1 except that the polymer (AG) was used instead of the polymer (AA) when forming the gate insulating layer.

Example A8

A thin film transistor was manufactured in the same manner as Example A1 except that the polymer (AH) was used instead of the polymer (AA) when forming the gate insulating layer.

Example A9

A thin film transistor was manufactured in the same manner as Example A1 except that the polymer (AI) was used instead of the polymer (AA) when forming the gate insulating layer.

Example A10

A thin film transistor was manufactured in the same manner as Example A1 except that the gate electrode was formed by depositing gold. In Table 1 below, a case that the gold deposition was used when forming the gate electrode is indicated as "Au".

Example A11

A thin film transistor was manufactured in the same manner as Example A1 except that a water dispersion liquid of poly(3,4-ethylenedioxythiophene)/poly(styrene sulfonic acid) (PEDOT/PSS) was used instead of the water dispersion liquid containing Ag particles when forming the gate electrode.

In Table 1 below, a case that the water dispersion liquid of poly(3,4-ethylenedioxythiophene)/poly(styrene sulfonic acid) was used when forming the gate electrode is indicated as "PEDOT/PSS".

Example A12

A thin film transistor was manufactured in the same manner as Example A1 except that MEH-PPV was used instead of the F8T2 when forming the organic semiconductor layer.

Example A13

First, a glass substrate ("OA10" produced by NEC Corning Inc.) was prepared, washed with water and then dried.

Next, a 0.7 wt % butyl acetate solution of the polymer (AA) was applied onto the glass substrate using a spin coating method, and then dried for 10 minutes at 60° C. In this way, a buffer layer having an average thickness of 50 nm was obtained.

Next, a gold thin film was formed onto the buffer layer so as to correspond to a shape of each of a source electrode and a drain electrode using a mask vacuum deposition method. In this way, obtained were the source electrode and the drain electrode each made of Au, having an average thickness of 100 nm and a channel width of 1 mm. A channel length (a distance between the source electrode and the drain electrode) was 50 μm.

Next, a 1 wt % toluene solution of F8T2 (produced by ADS, Inc.) which was a derivative of a fluorine-bithiophene copolymer was applied onto the buffer layer on which the source electrode and the drain electrode were formed using a spin coating method, and then dried for 10 minutes at 60° C. In this way, an organic semiconductor layer having an average thickness of 50 nm was obtained.

Next, a 5 wt % butyl acetate solution of the polymer (AA) was applied so as to cover the organic semiconductor layer, the source electrode and the drain electrode using a spin coating method, and then dried for 10 minutes at 60° C. In this way, a gate insulating layer having an average thickness of 500 nm was obtained.

Next, a water dispersion liquid of Ag particles was applied onto the gate insulating layer so as to correspond to a region between the source electrode and the drain electrode using an ink-jet method, and then dried for 10 minutes at 80° C. In this way, a gate electrode having an average thickness of 100 nm and an average width of 70 μm was obtained.

In Table 1 below, a case that the water dispersion liquid of Ag particles was used when forming the gate electrode is indicated as "Ag-IJ".

Example A14

First, a glass substrate ("OA10" produced by NEC Corning Inc.) was prepared, washed with water and then dried.

Next, a gold thin film was formed onto the glass substrate so as to correspond to a shape of each of a source electrode and a drain electrode using a mask vacuum deposition method. In this way, obtained were the source electrode and the drain electrode each made of Au, having an average thickness of 100 nm and a channel width of 1 mm. A channel length (a distance between the source electrode and the drain electrode) was 50 μm.

Next, a 1 wt % toluene solution of F8T2 (produced by ADS, Inc.) which was a derivative of a fluorine-bithiophene copolymer was applied onto the glass substrate on which the source electrode and the drain electrode were formed using a spin coating method, and then dried for 10 minutes at 60° C. In this way, an organic semiconductor layer having an average thickness of 50 nm was obtained.

Next, a 5 wt % butyl acetate solution of the polymer (AA) was applied so as to cover the organic semiconductor layer, the source electrode and the drain electrode using a spin coating method, and then dried for 10 minutes at 60° C. In this way, a gate insulating layer having an average thickness of 500 nm was obtained.

Next, a water dispersion liquid of Ag particles was applied onto the gate insulating layer so as to correspond to a region between the source electrode and the drain electrode using an ink-jet method, and then dried for 10 minutes at 80° C. In this way, a gate electrode having an average thickness of 100 nm and an average width of 70 μm was obtained.

In Table 1 below, a case that the water dispersion liquid of Ag particles was used when forming the gate electrode is indicated as "Ag-IJ".

Comparative Example A1

A thin film transistor was manufactured in the same manner as Example A1 except that polymethyl methacrylate (PMMA) was used instead of the polymer (AA) when forming the gate insulating layer. In this regard, it is to be noted that ΔVth of the thin film transistor was −15 [V].

Comparative Example A2

A thin film transistor was manufactured in the same manner as Example A1 except that a fluorine-based polymer ("CYTOP" produced by ASAHI GLASS CO., LTD.) was used instead of the polymer (AA) when forming the gate insulating layer. In this regard, it is to be noted that a fluorine-based solvent was used as a solvent.

Comparative Example A3

A thin film transistor was manufactured in the same manner as Example A1 except that polyvinyl alcohol (PVA) was used instead of the polymer (AA) when forming the gate insulating layer.

Comparative Example A4

A thin film transistor was manufactured in the same manner as Example A10 except that polymethyl methacrylate (PMMA) was used instead of the polymer (AA) when forming the gate insulating layer.

Comparative Example A5

A thin film transistor was manufactured in the same manner as Example A11 except that polymethyl methacrylate (PMMA) was used instead of the polymer (AA) when forming the gate insulating layer.

Comparative Example A6

A thin film transistor was manufactured in the same manner as Example A12 except that polymethyl methacrylate (PMMA) was used instead of the polymer (AA) when forming the gate insulating layer.

Comparative Example A7

A thin film transistor was manufactured in the same manner as Example A12 except that a fluorine-based polymer ("CYTOP" produced by ASAHI GLASS CO., LTD.) was used instead of the polymer (AA) when forming the gate insulating layer. In this regard, it is to be noted that a fluorine-based solvent was used as a solvent.

Comparative Example A8

A thin film transistor was manufactured in the same manner as Example A12 except that polyvinyl alcohol (PVA) was used instead of the polymer (AA) when forming the gate insulating layer.

Comparative Example A9

A thin film transistor was manufactured in the same manner as Example A14 except that polyvinyl alcohol (PVA) was used instead of the polymer (AA) when forming the gate insulating layer.

3. Various Kinds of Measurements

Permittivity, water absorption and a molecular weight of the polymer (insulating polymer) used in each of Examples A1 to A14 and Comparative Examples A1 to A9 were measured as follows.

<<Permittivity>>

First, the polymer (insulating polymer) was applied onto a copper plate using a spin coater, and then dried for 10 minutes at 80° C. and for 30 minutes at 150° C., to obtain a thin film (insulating film) having a thickness of 10 μm. Next, Au was deposited onto a surface of the thin film (an opposite surface of the thin film from the copper plate) to form an electrode.

In this way, an evaluation sample in which electrodes were formed on both surfaces of the insulating film, respectively, was obtained. Permittivity of this evaluation sample was measured using an impedance analyzer ("HP-4292A" produced by Hewlett-Packard Development Company, L.P.).

<<Water Absorption>>

First, a solution was prepared by dissolving the polymer (insulating polymer) into an appropriate solvent selected from butyl acetate, cyclohexane and toluene. Next, this solution was applied onto a PET film having a size of 20 cm×20 cm square and a thickness of 40 μm, and then dried for 120 minutes at 80° C. In this way, a thin film containing the polymer was formed on the PET film. After the PET film was removed from the thin film, the thin film was post-heated to remove the solvent therefrom.

A weight of the thin film from which the solvent was removed was measured. Thereafter, the thin film was immersed into deionized water, and then a weight of the thin film after being immersed was measured. Water absorption of the thin film was determined based on a difference (ratio) between the two measured weights.

<<Molecular Weight (MW)>>

A molecular weight of the polymer (insulating polymer) was measured using a high performance GPC apparatus ("HLC-8220" produced by Tosoh Corporation) provided with 2 columns under the following conditions.

Extraction solvent: THF
Column: TSK-gel GMHXL
Extraction solvent flow rate: 1 mL/min
Column temperature: 40° C.

4. Evaluation

The polymer (insulating polymer) used in each of Examples A1 to A14 and Comparative Examples A1 to A9 was subjected to the following examinations.

(4-1) Thin Film Formative Examination

A thin film formative examination was carried out by applying the polymer (insulating polymer) onto a substrate using a spin coater, and then drying it to form a thin film having a thickness of about 1 μm. Such a thin film formative examination was repeated 100 times. The thin film formability was evaluated as follows.

A: The thin film could be formed in 95 to 100 thin film formative examinations.

B: The thin film could be formed in 70 to 94 thin film formative examinations.

C: The thin film could be formed in 10 to 69 thin film formative examinations.

D: The thin film could be formed in 0 to 9 thin film formative examinations.

(4-2) Dissoluble Examination to Solvent

Resolvability was evaluated by adding 9 g of a solvent selected from butyl acetate, cyclohexane and toluene to 1 g of the polymer (insulating polymer). In this regard, it is to be noted that this examination was carried out by maintaining the solvent to a temperature of 25° C. The resolvability was evaluated as follows.

A: The polymer was perfectly dissolved into the solvent.
B: The polymer was partially dissolved into the solvent.
C: The polymer was swelled by the solvent.
D: The polymer was not dissolved into the solvent.

Further, on 200 organic semiconductor elements obtained in each of Examples A1 to A14 and Comparative Examples A1 to A9, the following examination was carried out.

(4-3) Communicable Examination

Communicability was measured in an ambient gas (25° C., 60% RH) such as nitrogen gas ($N_2$) or air. Thereafter, based on the obtained results, mobility, an ON-OFF ratio which is a ratio of ON current to OFF current and threshold voltage (Vth) in each ambient gas were calculated.

In this regard, it is to be noted that the mobility and the ON-OFF ratio are indicated in Table 1. Further, 5 or more dielectric breakdown examinations were carried out in the air (25° C., 60% RH), a minimum valve is indicated as "Vbd" in Table 1. Furthermore, each value in Table 1 is an average value of data obtained from the 200 thin film transistors.

The result of each of the above examinations (4-1) to (4-3) is shown in Table 1.

TABLE 1

| | Organic semiconductor layer | Gate insulating layer | Gate electrode | Molecular weight (Mw) | Permittivity (100 kHz) | Resolvability Butyl acetate | Cyclohexane | Toluene |
|---|---|---|---|---|---|---|---|---|
| Ex. A1 | F8T2 | Polymer (AA) | Ag-IJ | 68,000 | 3.12 | A | A | A |
| Ex. A2 | F8T2 | Polymer (AB) | Ag-IJ | 102,000 | 3.05 | A | A | A |
| Ex. A3 | F8T2 | Polymer (AC) | Ag-IJ | 166,000 | 3.18 | A | A | A |
| Ex. A4 | F8T2 | Polymer (AD) | Ag-IJ | 76,000 | 3.12 | A | A | A |
| Ex. A5 | F8T2 | Polymer (AE) | Ag-IJ | 58,000 | 3.05 | A | A | A |
| Ex. A6 | F8T2 | Polymer (AF) | Ag-IJ | 110,000 | 2.78 | A | A | A |
| Ex. A7 | F8T2 | Polymer (AG) | Ag-IJ | 31,000 | 3.24 | C | A | C |
| Ex. A8 | F8T2 | Polymer (AH) | Ag-IJ | 48,000 | 3.10 | A | A | A |
| Ex. A9 | F8T2 | Polymer (AI) | Ag-IJ | 67,000 | 3.15 | C | A | C |
| Ex. A10 | F8T2 | Polymer (AA) | Au | 68,000 | 3.12 | A | A | A |
| Ex. A11 | F8T2 | Polymer (AA) | PEDOT/PSS | 68,000 | 3.12 | A | A | A |

TABLE 1-continued

| | | | | | | | | |
|---|---|---|---|---|---|---|---|---|
| Ex. A12 | MEH-PPV | Polymer (AA) | Ag-IJ | 68,000 | 3.12 | A | A | A |
| Ex. A13 | F8T2 | Polymer (AA) | Ag-IJ | 68,000 | 3.12 | A | A | A |
| Ex. A14 | F8T2 | Polymer (AA) | Ag-IJ | 68,000 | 3.12 | A | A | A |
| Com. Ex. A1 | F8T2 | PMMA | Ag-IJ | 350,000 | 3.30 | B | B | B |
| Com. Ex. A2 | F8T2 | Fluorine-based polymer | Ag-IJ | 120,000 | 2.18 | D | D | D |
| Com. Ex. A3 | F8T2 | Polyvinyl alcohol | Ag-IJ | 32,000 | 3.20 | D | D | D |
| Com. Ex. A4 | F8T2 | PMMA | Au | 350,000 | 3.30 | B | B | B |
| Com. Ex. A5 | F8T2 | PMMA | PEDOT/PSS | 350,000 | 3.30 | B | B | B |
| Com. Ex. A6 | MEH-PPV | PMMA | Ag-IJ | 350,000 | 3.30 | B | B | B |
| Com. Ex. A7 | MEH-PPV | Fluorine-based polymer | Ag-IJ | 120,000 | 2.18 | D | D | D |
| Com. Ex. A8 | MEH-PPV | Polyvinyl alcohol | Ag-IJ | 32,000 | 2.00 | D | D | D |
| Com. Ex. A9 | F8T2 | Polyvinyl alcohol | Ag-IJ | 68,000 | 3.12 | D | D | D |

| | Water Absorption (24 hours) | Thin film formability | Mobility in $N_2$ ($cm^2/Vs$) | Mobility in air ($cm^2/Vs$) | on/off ratio in $N_2$ | on/off ratio in air | Vbd in air (V) |
|---|---|---|---|---|---|---|---|
| Ex. A1 | <0.1% | A | $8.0 \times 10^{-3}$ | $5.0 \times 10^{-3}$ | $10^6$ | $10^5$ | 60 |
| Ex. A2 | <0.1% | A | $9.0 \times 10^{-3}$ | $5.0 \times 10^{-3}$ | $10^5$ | $10^5$ | 60 |
| Ex. A3 | <0.1% | A | $2.0 \times 10^{-3}$ | $8.0 \times 10^{-4}$ | $10^5$ | $10^4$ | 65 |
| Ex. A4 | <0.1% | A | $5.5 \times 10^{-3}$ | $1.5 \times 10^{-3}$ | $10^6$ | $10^6$ | 60 |
| Ex. A5 | <0.1% | A | $1.0 \times 10^{-3}$ | $8.5 \times 10^{-4}$ | $10^5$ | $10^4$ | 55 |
| Ex. A6 | <0.1% | A | $1.0 \times 10^{-2}$ | $7.0 \times 10^{-3}$ | $10^3$ | $10^3$ | 60 |
| Ex. A7 | <0.1% | A | $6.0 \times 10^{-5}$ | $4.5 \times 10^{-5}$ | $10^5$ | $10^4$ | 60 |
| Ex. A8 | <0.1% | A | $3.0 \times 10^{-4}$ | $3.0 \times 10^{-4}$ | $10^4$ | $10^3$ | 55 |
| Ex. A9 | <0.1% | A | $6.5 \times 10^{-5}$ | $5.0 \times 10^{-5}$ | $10^6$ | $10^5$ | 55 |
| Ex. A10 | <0.1% | A | $2.0 \times 10^{-2}$ | $9.5 \times 10^{-3}$ | $10^6$ | $10^5$ | >100 |
| Ex. A11 | <0.1% | A | $5.0 \times 10^{-3}$ | $3.0 \times 10^{-3}$ | $10^6$ | $10^5$ | 70 |
| Ex. A12 | <0.1% | A | $7.0 \times 10^{-3}$ | $5.0 \times 10^{-3}$ | $10^5$ | $10^4$ | 65 |
| Ex. A13 | <0.1% | A | $4.0 \times 10^{-4}$ | $2.0 \times 10^{-4}$ | $10^5$ | $10^4$ | 60 |
| Ex. A14 | <0.1% | A | $1.0 \times 10^{-4}$ | $6.0 \times 10^{-5}$ | $10^4$ | $10^4$ | 65 |
| Com. Ex. A1 | 0.3% | C | $5.0 \times 10^{-3}$ | $2.0 \times 10^{-3}$ | $10^6$ | $10^5$ | 30 |
| Com. Ex. A2 | <0.1% | C | $1.0 \times 10^{-3}$ | $8.0 \times 10^{-4}$ | $10^3$ | $10^2$ | 50 |
| Com. Ex. A3 | 2.1% | D | $6.0 \times 10^{-5}$ | $4.0 \times 10^{-5}$ | $10^4$ | $10^3$ | 30 |
| Com. Ex. A4 | 0.3% | C | $5.0 \times 10^{-3}$ | $4.0 \times 10^{-3}$ | $10^6$ | $10^5$ | 80 |
| Com. Ex. A5 | 0.3% | C | $5.0 \times 10^{-3}$ | $8.0 \times 10^{-4}$ | $10^6$ | $10^3$ | 30 |
| Com. Ex. A6 | 0.3% | C | $7.0 \times 10^{-5}$ | $4.0 \times 10^{-5}$ | $10^5$ | 10 | 25 |
| Com. Ex. A7 | <0.1% | C | $8.0 \times 10^{-5}$ | $2.0 \times 10^{-5}$ | $10^3$ | 10 | 40 |
| Com. Ex. A8 | 2.1% | D | $8.0 \times 10^{-5}$ | $5.0 \times 10^{-5}$ | $10^5$ | 10 | 45 |
| Com. Ex. A9 | 1.9% | D | $8.0 \times 10^{-5}$ | $3.0 \times 10^{-5}$ | $10^4$ | $10^3$ | 30 |

As shown in Table 1, in each thin film transistor, the mobility in the air tends to degrade as compared with that in the nitrogen gas.

However, the mobility degradation of the thin film transistor obtained in each of Examples appears to be lower than that of the thin film transistor obtained in Comparative Example corresponding to each Example.

The same tendency is obtained in the on-off ratio.

Further, the ΔVth of the thin film transistor obtained in each of Examples also appears to be lower than that of the thin film transistor obtained in Comparative Example corresponding to each Example.

Furthermore, the dielectric breakdown voltage in the air of the thin film transistor obtained in each of Examples generally tends to increase as compared with that of the thin film transistor obtained in each of Comparative Examples. Such a tendency stands out in the case where the gate electrode was formed of the Ag particles or the PEDOT/PSS.

Example B

1. Manufacture of Thin Film Transistor 200 thin film transistors were manufactured in each of Examples B1 to B12 and Comparative Examples B1.

Each of the thin film transistors was manufactured as follows.

Example B1

First, 15.45 g (27.7 mmol) of bis(2,3,4,5,6-pentafluorobenzoyl)diphenyl ether (hereinbelow, abbreviated as "BPDE") which was the fluorine monomer represented by the above chemical formula (FM-1), 6.16 g (27 mmol) of bisphenol A (hereinbelow, abbreviated as "BisA") which was the bisphenol represented by the above chemical formula (BPM-1), 11.17 g (80.8 mmol) of potassium carbonate, 6.8 g of molecular sieve and 81 g of methyl ethyl ketone were mixed, and then reacted for 7 hours at 79° C. to obtain a polymer solution.

In this regard, it is to be noted that a feed ratio of the fluorine monomer represented by the above chemical formula (FM-1) to the bisphenol represented by the above chemical formula (BPM-1) was 1.025/1 as described above. Thereafter, the polymer solution was diluted by butyl acetate and filtrated, and then washed with deionized water in a separatory funnel.

Finally, the washed polymer solution was evaporated to thereby obtain a polymer (BD) represented by the following chemical formula and having a theoretical phenol value of 0 (zero).

[Formula 26]

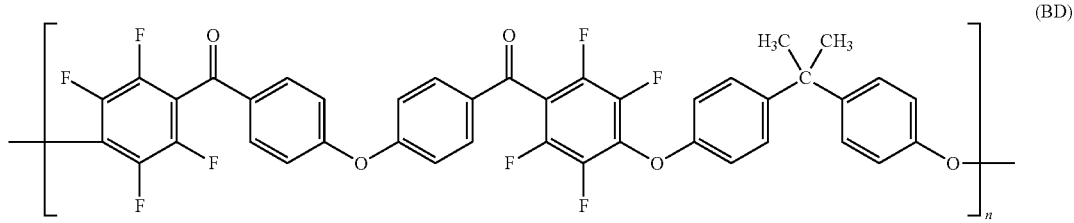

Aside from the step of preparing the polymer (insulating polymer) (BD), first, a glass substrate ("OA10" produced by NEC Corning Inc.) was prepared, washed with water and then dried. Next, an acryl-based ultraviolet curable resin composition was applied onto the glass substrate using a spin coating method (2,400 rpm, 30 seconds), and then cured by being irradiated with an ultraviolet ray. In this way, a buffer layer having an average thickness of 500 nm was obtained.

Next, a gold thin film was formed onto the buffer layer using a deposition method. Thereafter, a resist layer was formed onto the gold thin film, and then the gold thin film was etched using the resist layer as a mask. In this way, obtained were a source electrode and a drain electrode each having an average thickness of 100 nm and a channel width of 1 mm. A channel length (a distance between the source electrode and the drain electrode) was 10 μm.

Next, a 1 wt % toluene solution of poly(3-hexyl thiophene-2,4-diyl) (P3HT) was applied onto the buffer layer on which the source electrode and the drain electrode were formed using an ink-jet method, and then dried for 10 minutes at 100° C. In this way, an organic semiconductor layer having an average thickness of 50 nm was obtained.

Next, a 7 wt % butyl acetate solution of the polymer (BD) was applied so as to cover the organic semiconductor layer, the source electrode and the drain electrode using a spin coating method (2,000 rpm, 60 seconds), and then dried for 10 minutes at 60° C. In this way, a gate insulating layer having an average thickness of 500 nm was obtained.

Next, a water dispersion liquid of Ag particles was applied onto the gate insulating layer so as to correspond to a region between the source electrode and the drain electrode using an ink-jet method, and then dried for 10 minutes at 80° C. In this way, a gate electrode having an average thickness of 100 nm and an average width of 30 μm was obtained.

In Table 2 below, a case that the water dispersion liquid of Ag particles was used when forming the gate electrode is indicated as "Ag-IJ".

Example B2

In the step of preparing the insulating polymer, first, 12.1 g (20.5 mmol) of 2,2-bis(2,3,4,5,6-pentafluorobenzoyl oxy) diphenyl ether which was the fluorine monomer represented by the above chemical formula (FM-2), 4.56 g (20 mmol) of BisA which was the bisphenol represented by the above chemical formula (BPM-1), 5.53 g (40 mmol) of potassium carbonate, 7 g of molecular sieve and 90 g of methyl ethyl ketone were mixed, and then reacted for 7.5 hours at 79° C. to obtain a polymer solution.

In this regard, it is to be noted that a feed ratio of the fluorine monomer represented by the above chemical formula (FM-2) to the bisphenol represented by the above chemical formula (BPM-1) was 1.025/1 as described above. Thereafter, the polymer solution was diluted by butyl acetate and filtrated, and then washed with deionized water in a separatory funnel.

Finally, the washed polymer solution was evaporated to thereby obtain a polymer (BE) represented by the following chemical formula and having a theoretical phenol value of 0 (zero).

A thin film transistor was manufactured in the same manner as Example B1 except that this polymer (BE) was used instead of the polymer (BD) when forming the gate insulating layer.

[Formula 27]

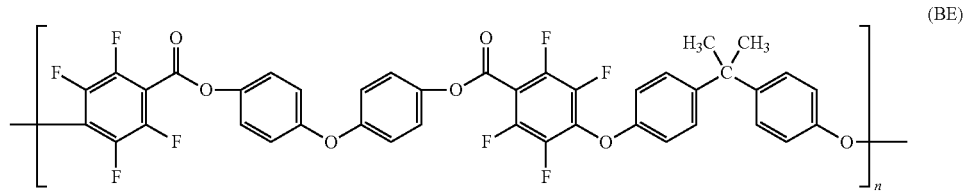

Example B3

In the step of preparing the insulating polymer, the feed ratio of the fluorine monomer represented by the above chemical formula (FM-1) to the bisphenol represented by the above chemical formula (BPM-1) was changed to 1/1 to thereby obtained a polymer (BD) having a weight average molecular weight of 150,000.

A thin film transistor was manufactured in the same manner as Example B1 except that this polymer (BD) was used when forming the gate insulating layer.

Example B4

In the step of preparing the insulating polymer, first, 6.75 g (30 mmol) of BPDE which was the fluorine monomer represented by the above chemical formula (FM-1), 10.08 g (30 mmol) of 2,2-dihydroxyphenyl hexafruoropropane which was the bisphenol represented by the above chemical formula (BPM-2), 4.55 g (32.9 mmol) of potassium carbonate, 5.4 g of molecular sieve and 90 g of dimethyl acetoamide were mixed, and then reacted for 6 hours at 60° C. to obtain a polymer solution.

In this regard, it is to be noted that a feed ratio of the fluorine monomer represented by the above chemical formula (FM-1) to the bisphenol represented by the above chemical formula (BPM-2) was 1/1 as described above. Thereafter, the polymer solution was diluted by acetone and filtrated, and then the filtrated polymer solution was added to deionized water to reprecipitate a solid.

Next, the reprecipitated solid was filtrated and dried. Thereafter, a reprecipitation process, in which the reprecipitated solid was once again dissolved into acetone and the acetone was added to deionized water, was repeated two times to obtain a solid. Finally, the solid was filtrated and dried to thereby obtain a polymer (BF) represented by the following chemical formula.

A thin film transistor was manufactured in the same manner as Example B1 except that this polymer (BF) instead of the polymer (BD) was used when forming the gate insulating layer.

[Formula 28]

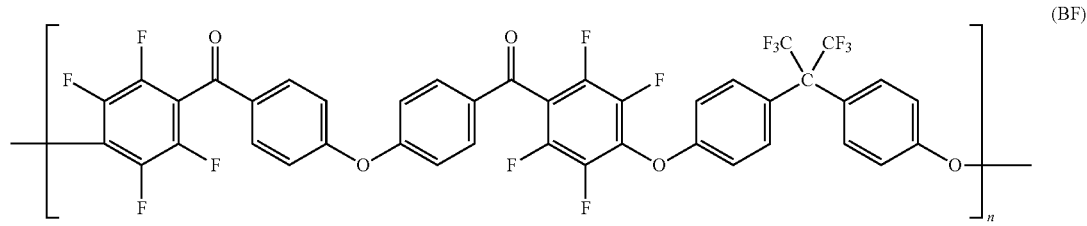

(BF)

Example B5

In the step of preparing the insulating polymer, the feed ratio of the fluorine monomer represented by the above chemical formula (FM-1) to the bisphenol represented by the above chemical formula (BPM-1) was changed to 1.04/1 to thereby obtained a polymer (BD) having a weight average molecular weight of 36,000.

A thin film transistor was manufactured in the same manner as Example B1 except that this polymer (BD) was used when forming the gate insulating layer.

Example B6

A thin film transistor was manufactured in the same manner as Example B1 except that the gate electrode was formed by depositing gold. In Table 2 below, a case that the gold deposition was used when forming the gate electrode is indicated as "Au".

Example B7

A thin film transistor was manufactured in the same manner as Example B1 except that a water dispersion liquid of poly(3,4-ethylenedioxythiophene)/poly(styrene sulfonic acid) (PEDOT/PSS) was used instead of the water dispersion liquid of Ag particles when forming the gate electrode.

In Table 2 below, a case that the water dispersion liquid of poly(3,4-ethylenedioxythiophene)/poly(styrene sulfonic acid) was used when forming the gate electrode is indicated as "PEDOT/PSS".

Example B8

The polymer (BD) was obtained in the same manner as Example B1.

Aside from the step of preparing the polymer (insulating polymer) (BD), first, a glass substrate ("OA10" produced by NEC Corning Inc.) was prepared, washed with water and then dried. Next, an acryl-based ultraviolet curable resin composition was applied onto the glass substrate using a spin coating method (2,400 rpm, 30 seconds), and then cured by being irradiated with an ultraviolet ray. In this way, a lower buffer layer having an average thickness of 500 nm was obtained.

Next, a 0.7 wt % butyl acetate solution of the polymer (BD) was applied onto the lower buffer layer using a spin coating method, and then dried for 10 minutes at 60° C. In this way, a buffer layer having an average thickness of 50 nm was obtained.

Next, a gold thin film was formed onto the buffer layer so as to correspond to a shape of each of a source electrode and a drain electrode using a mask vacuum deposition method. In this way, obtained were the source electrode and the drain electrode each made of Au, having an average thickness of 100 nm and a channel width of 1 mm. A channel length (a distance between the source electrode and the drain electrode) was 50 μm.

Next, a 1 wt % toluene solution of poly(3-hexyl thiophene-2,4-diyl) (P3HT) was applied onto the buffer layer on which the source electrode and the drain electrode were formed using an ink-jet method, and then dried for 10 minutes at 100° C. In this way, an organic semiconductor layer having an average thickness of 50 nm was obtained.

Next, a 7 wt % butyl acetate solution of the polymer (BD) was applied so as to cover the organic semiconductor layer, the source electrode and the drain electrode using a spin coating method (2,000 rpm, 60 seconds), and then dried for 10 minutes at 60° C. In this way, a gate insulating layer having an average thickness of 500 nm was obtained.

Next, a water dispersion liquid of Ag particles was applied onto the gate insulating layer so as to correspond to a region between the source electrode and the drain electrode using an ink-jet method, and then dried for 10 minutes at 80° C. In this way, a gate electrode having an average thickness of 100 nm and an average width of 70 μm was obtained.

Example B9

In the step of preparing the insulating polymer, the feed ratio of the fluorine monomer represented by the above chemical formula (FM-1) to the bisphenol represented by the above chemical formula (BPM-1) was changed to 1/1 to thereby obtained a polymer (BD) having a weight average molecular weight of 94,500.

A thin film transistor was manufactured in the same manner as Example B1 except that this polymer (BD) was used when forming the gate insulating layer.

Example B10

A thin film transistor was manufactured in the same manner as Example B1 except that the feed ratio of the fluorine monomer represented by the above chemical formula (FM-1) to the bisphenol represented by the above chemical formula (BPM-1) was changed to 1/1.025 in the step of preparing the insulating polymer.

Example B11

A thin film transistor was manufactured in the same manner as Example B2 except that the feed ratio of the fluorine monomer represented by the above chemical formula (FM-2) to the bisphenol represented by the above chemical formula (BPM-1) was changed to 1/1.025 in the step of preparing the insulating polymer.

Example B12

The polymer (BD) was obtained in the same manner as Example B1.

Aside from the step of preparing the polymer (insulating polymer) (BD), first, a glass substrate ("OA10" produced by NEC Corning Inc.) was prepared, washed with water and then dried. Next, an acryl-based ultraviolet curable resin composition was applied onto the glass substrate using a spin coating method (2,400 rpm, 30 seconds), and then cured by being irradiated with an ultraviolet ray. In this way, a buffer layer having an average thickness of 500 nm was obtained.

Next, a gold thin film was formed onto the buffer layer so as to correspond to a shape of each of a source electrode and a drain electrode using a mask vacuum deposition method. In this way, obtained were the source electrode and the drain electrode each made of Au, having an average thickness of 100 nm and a channel width of 1 mm. A channel length (a distance between the source electrode and the drain electrode) was 50 µm.

Next, a 1 wt % toluene solution of poly(3-hexyl thiophene-2,4-diyl) (P3HT) was applied onto the buffer layer on which the source electrode and the drain electrode were formed using an ink-jet method, and then dried for 10 minutes at 100° C. In this way, an organic semiconductor layer having an average thickness of 50 nm was obtained.

Next, a 7 wt % butyl acetate solution of the polymer (BD) was applied so as to cover the organic semiconductor layer, the source electrode and the drain electrode using a spin coating method (2,000 rpm, 60 seconds), and then dried for 10 minutes at 60° C. In this way, a gate insulating layer having an average thickness of 500 nm was obtained.

Next, a water dispersion liquid of Ag particles was applied onto the gate insulating layer so as to correspond to a region between the source electrode and the drain electrode using an ink-jet method, and then dried for 10 minutes at 80° C. In this way, a gate electrode having an average thickness of 100 nm and an average width of 70 µm was obtained.

Comparative Example A1

A thin film transistor was manufactured in the same manner as Example B1 except that polymethyl methacrylate (PMMA) was used instead of the polymer (BD) when forming the gate insulating layer.

2. Various Kinds of Measurements

Permittivity, water absorption and a molecular weight of the polymer (insulating polymer) used in each of Examples B1 to B12 and Comparative Example B1 were measured as follows.

<<Permittivity>>

First, the polymer (insulating polymer) was applied onto a copper plate using a spin coater, and then dried for 10 minutes at 80° C. and for 30 minutes at 150° C., to obtain a thin film (insulating film) having a thickness of 10 µm. Next, Au was deposited onto a surface of the thin film (an opposite surface of the thin film from the copper plate) to form an electrode.

In this way, an evaluation sample in which electrodes were formed on both surfaces of the insulating film, respectively was obtained. Permittivity of this evaluation sample was measured using an impedance analyzer ("HP-4292A" produced by Hewlett-Packard Development Company, L.P.).

<<Water Absorption>>

First, a solution was prepared by dissolving the polymer (insulating polymer) into an appropriate solvent selected from butyl acetate, cyclohexane and toluene. Next, this solution was applied onto a PET film having a size of 20 cm×20 cm square and a thickness of 40 µm, and then dried for 120 minutes at 80° C. In this way, a thin film containing the polymer was formed on the PET film. After the PET film was removed from the thin film, the thin film was post-heated to remove the solvent therefrom.

A weight of the thin film from which the solvent was removed was measured. Thereafter, the thin film was immersed into deionized water, and then a weight of the thin film after being immersed was measured. Water absorption of the thin film was determined based on a difference (ratio) between the two measured weights.

<<Molecular Weight (MW)>>

A molecular weight of the polymer (insulating polymer) was measured using a high performance GPC apparatus ("HLC-8220" produced by Tosoh Corporation) provided with 2 columns under the following conditions.

Extraction solvent: THF
Column: TSK-gel GMHXL
Extraction solvent flow rate: 1 mL/min
Column temperature: 40° C.

3. Evaluation

The polymer (insulating polymer) used in each of Examples B1 to B12 and Comparative Example B1 was subjected to the following examinations.

(3-1) Thin Film Formative Examination

A thin film formative examination was carried out by applying the polymer (insulating polymer) onto a substrate using a spin coater, and then drying it to form a thin film having a thickness of about 1 µm. Such a thin film formative examination was repeated 100 times. The thin film formability was evaluated as follows.

A: The thin film could be formed in 95 to 100 thin film formative examinations.

B: The thin film could be formed in 70 to 94 thin film formative examinations.

C: The thin film could be formed in 10 to 69 thin film formative examinations.

D: The thin film could be formed in 0 to 9 thin film formative examinations.

Further, 5 or more dielectric breakdown examinations were carried out in the air (25° C., 60% RH), a minimum valve is indicated as "Vbd" in Table 2. Furthermore, each value in Table 2 is an average value of data obtained from the 200 thin film transistors.

The result of each of the above "2. Various kinds of measurements" and "3. Evaluation" is shown in Table 2.

TABLE 2

| | Organic semiconductor layer | Gate insulating layer | Feed ratio (fluorine monomer/Bisphenol) | Weight Average Molecular weight (Mw) | Number Average Molecular weight (Mn) | Theoretical Phenol Value (KOH mg/ polymer g) | Gate electrode | Permittivity (100 kHz) |
|---|---|---|---|---|---|---|---|---|
| Ex. B1 | P3HT | Polymer (BD) | 1.025/1 | 68,000 | 14,600 | 0 | Ag-IJ | 3.12 |
| Ex. B2 | P3HT | Polymer (BE) | 1.025/1 | 76,000 | 17,400 | 0 | Ag-IJ | 3.12 |
| Ex. B3 | P3HT | Polymer (BD) | 1.0/1.0 | 150,000 | 29,000 | 1.93 | Ag-IJ | 3.13 |
| Ex. B4 | P3HT | Polymer (BF) | 1.0/1.0 | 166,000 | 30,000 | 1.87 | Ag-IJ | 2.78 |
| Ex. B5 | P3HT | Polymer (BD) | 1.04/1 | 36,000 | 10,100 | 0 | Ag-IJ | 3.12 |
| Ex. B6 | P3HT | Polymer (BD) | 1.025/1 | 68,000 | 14,600 | 0 | Au | 3.12 |
| Ex. B7 | P3HT | Polymer (BD) | 1.025/1 | 68,000 | 14,600 | 0 | PEDOT/PSS | 3.12 |
| Ex. B8 | P3HT | Polymer (BD) | 1.025/1 | 68,000 | 14,600 | 0 | Ag-IJ | 3.12 |
| Ex. B9 | P3HT | Polymer (BD) | 1.0/1.0 | 94,500 | 19,700 | 2.8 | Ag-IJ | 3.12 |
| Ex. B10 | P3HT | Polymer (BD) | 1/1.025 | 66,300 | 14,900 | 3.7 | Ag-IJ | 3.13 |
| Ex. B11 | P3HT | Polymer (BE) | 1/1.025 | 65,000 | 15,800 | 3.6 | Ag-IJ | 3.14 |
| Ex. B12 | P3HT | Polymer (BD) | 1.025/1 | 68,000 | 14,600 | 0 | Ag-IJ | 3.12 |
| Com. Ex. B1 | P3HT | PMMA | — | 45,000 | — | 0 | Ag-IJ | 3.70 |

| | Resolvability | | | Water Absorption (24 hours) | Thin film formability | Mobility in $N_2$ ($cm^2/Vs$) | Mobility in air ($cm^2/Vs$) | on/off ratio in $N_2$ | on/off ratio in air | $\Delta$Vth (V) | Vbd in air (V) |
|---|---|---|---|---|---|---|---|---|---|---|---|
| | Butyl acetate | Cyclo-hexane | Toluene | | | | | | | | |
| Ex. B1 | A | A | A | <0.07% | A | $1.5 \times 10^{-2}$ | $1.0 \times 10^{-2}$ | $10^6$ | $10^6$ | 0 | >100 |
| Ex. B2 | A | A | A | <0.07% | A | $1.0 \times 10^{-2}$ | $1.0 \times 10^{-2}$ | $10^6$ | $10^6$ | 0 | >100 |
| Ex. B3 | A | A | A | <0.07% | A | $2.0 \times 10^{-3}$ | $1.0 \times 10^{-3}$ | $10^5$ | $10^4$ | −3 | 70 |
| Ex. B4 | A | A | A | <0.07% | A | $8.0 \times 10^{-3}$ | $6.0 \times 10^{-3}$ | $10^4$ | $10^3$ | −3 | 70 |
| Ex. B5 | A | A | A | <0.07% | A | $6.0 \times 10^{-3}$ | $4.0 \times 10^{-3}$ | $10^5$ | $10^4$ | −2 | 80 |
| Ex. B6 | A | A | A | <0.07% | A | $2.5 \times 10^{-2}$ | $2.0 \times 10^{-2}$ | $10^6$ | $10^6$ | 0 | >100 |
| Ex. B7 | A | A | A | <0.07% | A | $9.0 \times 10^{-3}$ | $3.0 \times 10^{-3}$ | $10^6$ | $10^5$ | −2 | 75 |
| Ex. B8 | A | A | A | <0.07% | A | $7.0 \times 10^{-3}$ | $6.0 \times 10^{-3}$ | $10^5$ | $10^5$ | 0 | >100 |
| Ex. B9 | A | A | A | 0.07% | A | $4.0 \times 10^{-4}$ | $1.0 \times 10^{-4}$ | $10^4$ | $10^4$ | −8 | 20 |
| Ex. B10 | A | A | A | 0.10% | A | $2.0 \times 10^{-4}$ | $6.0 \times 10^{-5}$ | $10^3$ | $10^3$ | −10 | 25 |
| Ex. B11 | A | A | A | 0.10% | A | $1.0 \times 10^{-4}$ | $5.0 \times 10^{-5}$ | $10^3$ | $10^3$ | −15 | 40 |
| Ex. B12 | A | A | A | <0.07% | A | $3.0 \times 10^{-3}$ | $2.5 \times 10^{-3}$ | $10^5$ | $10^5$ | 0 | >100 |
| Com. Ex. B1 | B | B | B | 0.30% | C | $6.0 \times 10^{-4}$ | $1.0 \times 10^{-4}$ | $10^4$ | $10^3$ | −15 | 30 |

(3-2) Dissoluble Examination to Solvent

Resolvability was evaluated by adding 9 g of a solvent selected from butyl acetate, cyclohexane and toluene to 1 g of the polymer (insulating polymer). In this regard, it is to be noted that this examination was carried out by maintaining the solvent to a temperature of 25° C. The resolvability was evaluated as follows.

A: The polymer was perfectly dissolved into the solvent.
B: The polymer was partially dissolved into the solvent.
C: The polymer was swelled by the solvent.
D: The polymer was not dissolved into the solvent.

Further, on 200 organic semiconductor elements obtained in each of Examples B1 to B12 and Comparative Example B1, the following examination was carried out.

(3-3) Communicable Examination

Communicability was measured in an ambient gas (25° C., 60% RH) such as nitrogen gas ($N_2$) or air. Thereafter, based on the obtained results, mobility, an ON-OFF ratio which is a ratio of ON current to OFF current and threshold voltage (Vth) in each ambient gas were calculated.

In this regard, it is to be noted that the mobility, the ON-OFF ratio and a difference between Vth in the nitrogen gas and Vth in the air ($\Delta$Vth=Vth (air)−Vth ($N_2$)) are indicated.

As shown in Table 2, in each thin film transistor, the mobility in the air tends to degrade as compared with that in the nitrogen gas. However, by using the polymer (insulating polymer) having the main chain whose at least one end is substituted from the fluorine atom or the substituent group containing fluorine atom(s) and having the theoretical phenol value of 2.0 KOH mg/polymer g or more, the mobility degradation of the thin film transistor obtained in each of Examples appears to be suppressed. The same tendency is obtained in the on-off ratio.

Further, by using the polymer (insulating polymer) having the main chain whose at least one end is substituted from the fluorine atom or the substituent group containing fluorine atom(s) and having the theoretical phenol value of 2.0 KOH mg/polymer g or more, the $\Delta$Vth of the thin film transistor also appear's to be suppressed.

Furthermore, the dielectric breakdown voltage in the air of the thin film transistor obtained in each of Examples tends to increase as compared with that of the thin film transistor obtained in Comparative Example. Such a tendency stands out in the case where the gate electrode was formed of the Ag particles or the PEDOT/PSS.

Moreover, the water absorption of the thin film transistor obtained in each of Examples is lower than that of Comparative Example. Among the thin film transistors obtained in Examples B1 to B12, the water absorption of the thin film transistor obtained in Example, in which the insulating polymer having the phenol value of 0 (zero) was used, becomes even lower.

Especially, the water absorption of the thin film transistor obtained in Example, in which the insulating polymer prepared by setting the feed ratio to 1.025/1 was used, becomes remarkably lower.

What is claimed is:

1. An organic semiconductor element, comprising:
   a source electrode;
   a drain electrode;
   a gate electrode;
   a gate insulating layer that insulates the source electrode and the drain electrode from the gate electrode;
   an organic semiconductor layer provided so as to make contact with the gate insulating layer, the source electrode and the drain electrode; and
   another insulating layer provided so as to make contact with the organic semiconductor layer at an opposite side from the gate insulating layer,
   wherein the organic semiconductor element further comprises a substrate and has a top gate structure in which the source electrode and the drain electrode are positioned closer to the substrate than the gate electrode,
   wherein at least the gate insulating layer contains the insulating polymer, and
   wherein at least one of the gate insulating layer and the another insulating layer contains an insulating polymer with a main chain having both end portions and including repeating units represented by the following general formula (1) or (2):

Formula (1)

Formula (2)

Formula (2)

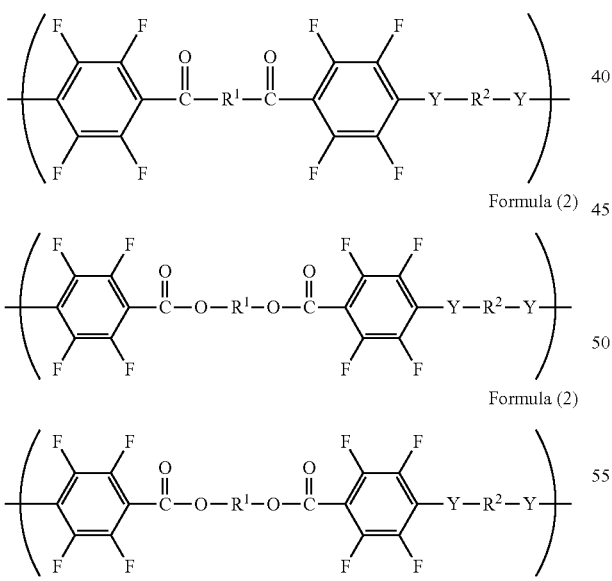

where $R^1$ and $R^2$ are the same or different and each of $R^1$ and $R^2$ is a divalent linkage group, and Y is an oxygen atom or a sulfur atom.

2. The organic semiconductor element as claimed in claim 1, wherein a permittivity at 100 kHz of the at least one of the gate insulating layer and another insulating layer is 2.9 or more.

3. The organic semiconductor element as claimed in claim 1, wherein a weight-average molecular weight of the insulating polymer is in the range of 5,000 to 500,000.

4. The organic semiconductor element as claimed in claim 1, wherein at least one of the end portions of the main chain of the insulating polymer is substituted by a fluorine atom or a substituent group containing fluorine atom(s), and
   wherein a theoretical phenol value of the insulating polymer is 2.0 KOH mg/polymer g or less.

5. The organic semiconductor element as claimed in claim 4, wherein the substituent group containing fluorine atom(s) is represented by the following chemical formula:

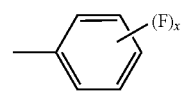

where X is an integral number of 1 to 5.

6. The organic semiconductor element as claimed in claim 1, wherein in the general formula (1) or (2), $R^1$ and $R^2$ are the same or different and each of $R^1$ and $R^2$ is any one of the following chemical formulas (3-1) to (3-13)

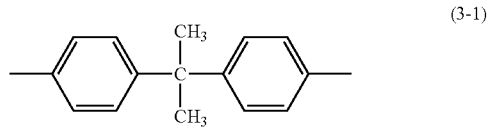
(3-1)

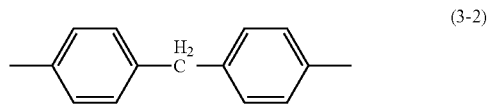
(3-2)

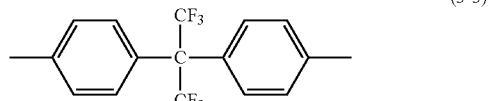
(3-3)

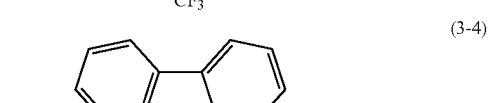
(3-4)

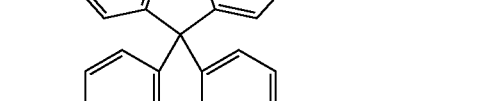
(3-5)

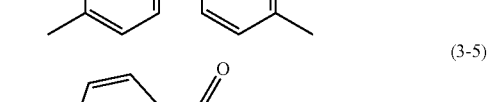
(3-6)

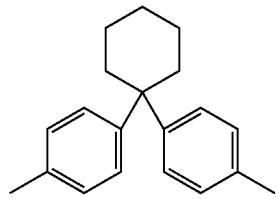

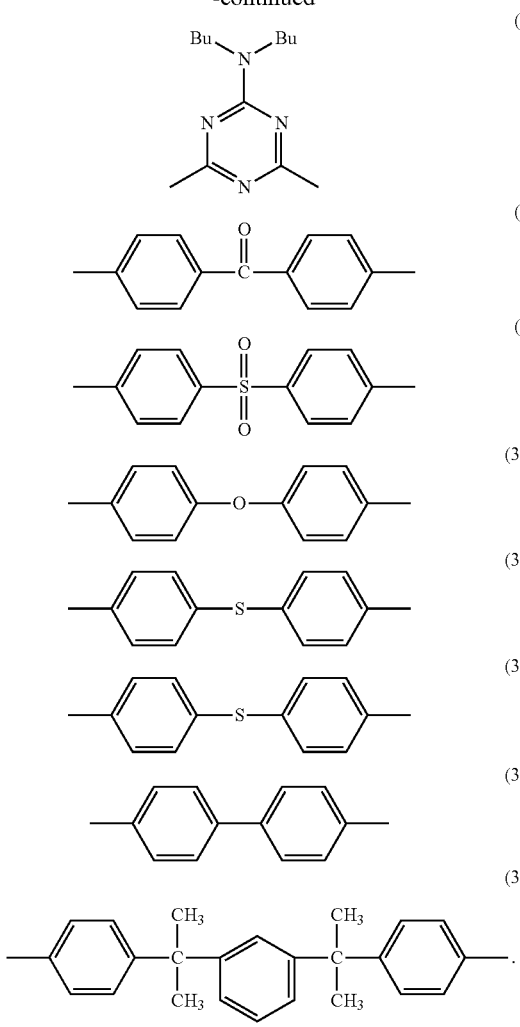

7. The organic semiconductor element as claimed in claim 6, wherein in the general formula (1) or (2), each of $R^1$ and $R^2$ includes no polar group.

8. The organic semiconductor element as claimed in claim 7, wherein in the general formula (1) or (2), $R^1$ and $R^2$ are the same or different and each of $R^1$ and $R^2$ is any one of the chemical formulas (3-1), (3-2), (3-4) and (3-10).

9. The organic semiconductor element as claimed in claim 1, wherein an average thickness of the gate insulating layer is in the range of 10 to 5,000 nm.

10. A method of manufacturing an organic semiconductor element having a source electrode, a drain electrode, a gate electrode, a gate insulating layer that insulates the source electrode and the drain electrode from the gate electrode, an organic semiconductor layer provided so as to make contact with the gate insulating layer, the source electrode and the drain electrode, and another insulating layer provided so as to make contact with the organic semiconductor layer at an opposite side from the gate insulating layer, the method comprising:

a first step of forming another insulating layer;

a second step of forming the source electrode and the drain electrode on another insulating layer so as to be separated from each other;

a third step of forming the organic semiconductor layer so as to make contact with the source electrode and the drain electrode;

a fourth step of forming the gate insulating layer so as to cover the source electrode, the drain electrode and the organic semiconductor layer; and a fifth step of forming the gate electrode on the gate insulating layer so as to correspond to a region between the source electrode and the drain electrode, wherein at least one of the first step and the fourth step is carried out through a liquid phase process using a solution prepared by dissolving an insulating polymer with a main chain having both end portions and including repeating units represented by the following general formula (1) or (2) into a solvent:

Formula (1)

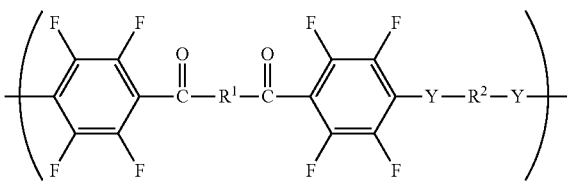

Formula (2)

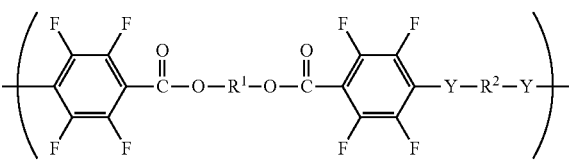

Formula (2)

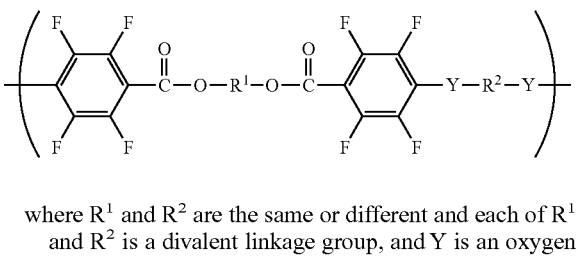

where $R^1$ and $R^2$ are the same or different and each of $R^1$ and $R^2$ is a divalent linkage group, and Y is an oxygen atom or a sulfur atom.

11. The method as claimed in claim 10, wherein at least one of the end portions of the main chain of the insulating polymer is substituted by a fluorine atom or a substituent group containing fluorine atom(s), and wherein a theoretical phenol value of the insulating polymer is 2.0 KOH mg/polymer g or less.

12. The method as claimed in claim 11, wherein the solvent is at least one of a ketone-based solvent and an ester-based solvent.

13. The method as claimed in claim 10, wherein in the fifth step, the gate electrode is formed through a liquid phase process using an electrode forming material prepared by dispersing a conductive polymer or metal particles into a water-based dispersion medium.

14. An electronic device, comprising the organic semiconductor element defined by claim 1.

15. Electronic equipment, comprising the electronic device defined by claim 14.

* * * * *